United States Patent
Song et al.

(10) Patent No.: US 11,217,680 B2
(45) Date of Patent: Jan. 4, 2022

(54) VERTICAL FIELD-EFFECT TRANSISTOR WITH T-SHAPED GATE

(71) Applicant: International Business Machines Corporation, Armonk, NY (US)

(72) Inventors: Yi Song, Albany, NY (US); Juntao Li, Cohoes, NY (US); Huimei Zhou, Albany, NY (US); Kangguo Cheng, Schenectady, NY (US); Ardasheir Rahman, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 16/420,530

(22) Filed: May 23, 2019

(65) Prior Publication Data

US 2020/0373413 A1    Nov. 26, 2020

(51) Int. Cl.

| | |
|---|---|
| *H01L 29/66* | (2006.01) |
| *H01L 29/423* | (2006.01) |
| *H01L 29/78* | (2006.01) |
| *H01L 21/308* | (2006.01) |
| *H01L 21/033* | (2006.01) |
| *H01L 21/28* | (2006.01) |
| *H01L 21/8234* | (2006.01) |

(52) U.S. Cl.
CPC .... *H01L 29/66666* (2013.01); *H01L 21/0332* (2013.01); *H01L 21/0338* (2013.01); *H01L 21/28114* (2013.01); *H01L 21/3081* (2013.01); *H01L 21/3086* (2013.01); *H01L 21/823475* (2013.01); *H01L 21/823481* (2013.01); *H01L 21/823487* (2013.01); *H01L 29/42376* (2013.01); *H01L 29/6656* (2013.01); *H01L 29/7827* (2013.01)

(58) Field of Classification Search
CPC ....... H01L 21/28114; H01L 21/823475; H01L 21/823481; H01L 21/823487; H01L 29/42376; H01L 29/66666; H01L 29/7827
See application file for complete search history.

(56) References Cited

U.S. PATENT DOCUMENTS

| | | |
|---|---|---|
| 6,891,235 B1 | 5/2005 | Furukawa et al. |
| 8,264,048 B2 | 9/2012 | Rachmady et al. |
| 9,716,170 B1 | 7/2017 | Cheng et al. |
| 9,786,784 B1 | 10/2017 | Song et al. |

(Continued)

*Primary Examiner* — Marcos D. Pizarro
(74) *Attorney, Agent, or Firm* — Erik Johnson; Ryan, Mason & Lewis, LLP

(57) ABSTRACT

A method of forming a semiconductor structure includes forming a fin over a substrate, forming a bottom source/drain over the substrate surrounding a first portion of sidewalls of the fin, and forming a bottom spacer over the bottom source/drain and surrounding a second portion of the sidewalls of the fin. The method also includes forming a T-shaped gate stack over the bottom spacer and surrounding a third portion of the sidewalls of the fin, forming a top spacer over the T-shaped gate stack and surrounding a fourth portion of the sidewalls of the fin, and forming a top source/drain over the top spacer and surrounding a fifth portion of the sidewalls and a top surface of the fin. The T-shaped gate stack includes a gate dielectric, a gate conductor, and a gate metal extending outward from a portion of sidewalls of the gate conductor between the bottom and top spacers.

7 Claims, 20 Drawing Sheets

(56) References Cited

U.S. PATENT DOCUMENTS

| | | | |
|---|---|---|---|
| 9,853,028 B1* | 12/2017 | Cheng | H01L 29/517 |
| 9,893,171 B2 | 2/2018 | Basker et al. | |
| 2012/0135573 A1 | 5/2012 | Kim | |
| 2012/0208364 A1 | 8/2012 | Rouh et al. | |
| 2014/0042524 A1* | 2/2014 | Chuang | H01L 21/823885 |
| | | | 257/329 |
| 2014/0252496 A1 | 9/2014 | Liu et al. | |
| 2017/0323969 A1* | 11/2017 | Masuoka | H01L 21/2018 |
| 2018/0331217 A1 | 11/2018 | Chi et al. | |

* cited by examiner

1800

VERTICAL FIELD-EFFECT TRANSISTOR WITH T-SHAPED GATE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming vertical field-effect transistors with T-shaped gates.

In one embodiment, a method of forming a semiconductor structure comprises forming at least one fin over a substrate, the at least one fin providing a channel for at least one vertical field-effect transistor, forming a bottom source/drain region over the substrate surrounding a first portion of sidewalls of the at least one fin, and forming a bottom spacer over the bottom source/drain region and surrounding a second portion of the sidewalls of the at least one fin. The method also comprises forming a T-shaped gate stack over the bottom spacer and surrounding a third portion of the sidewalls of the at least one fin, forming a top spacer over the T-shaped gate stack and surrounding a fourth portion of the sidewalls of the at least one fin, and forming a top source/drain region over the top spacer and surrounding a fifth portion of the sidewalls and a top surface of the at least one fin. The T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

In another embodiment, a semiconductor structure comprises a substrate, at least one fin disposed over the substrate, the at least one fin providing a channel for at least one vertical field-effect transistor, and a bottom source/drain region disposed over the substrate surrounding a first portion of sidewalls of the at least one fin. The semiconductor structure also comprises a bottom spacer disposed over the bottom source/drain region and surrounding a second portion of the sidewalls of the at least one fin, a T-shaped gate stack disposed over the bottom spacer and surrounding a third portion of the sidewalls of the at least one fin, a top spacer disposed over the T-shaped gate stack and surrounding a fourth portion of the sidewalls of the at least one fin, and a top source/drain region disposed over the top spacer and surrounding a fifth portion of the sidewalls and a top surface of the at least one fin. The T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

In another embodiment, an integrated circuit comprises a vertical field-effect transistor structure comprising a substrate, at least one fin disposed over the substrate, the at least one fin providing a channel for at least one vertical field-effect transistor, and a bottom source/drain region disposed over the substrate surrounding a first portion of sidewalls of the at least one fin. The vertical transport field-effect transistor structure also comprises a bottom spacer disposed over the bottom source/drain region and surrounding a second portion of the sidewalls of the at least one fin, a T-shaped gate stack disposed over the bottom spacer and surrounding a third portion of the sidewalls of the at least one fin, a top spacer disposed over the T-shaped gate stack and surrounding a fourth portion of the sidewalls of the at least one fin, and a top source/drain region disposed over the top spacer and surrounding a fifth portion of the sidewalls and a top surface of the at least one fin. The T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

DETAILED DESCRIPTION

Illustrative embodiments of the invention may be described herein in the context of illustrative methods for forming vertical field-effect transistors with T-shaped gates, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of majority carriers along a channel that runs past the gate between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques. Vertical FETs (VFETs) are considered as viable CMOS architectures for scaling to 5 nanometers (nm) node and beyond.

In some VFET structures, there is a large intrinsic overlap area between the gate and source/drain regions. Source parasitic capacitance (Cs) and drain parasitic capacitance (Cd) are asymmetric in a conventional VFET that has an L-shaped gate configuration. This is due to the bottom spacer thickness being smaller than the combined thickness of the top spacer plus the gate length ($L_{gate}$) minus the gate width. Cs and Cd cannot be flexibly adjusted in conventional VFETs because the top spacer thickness is largely determined by fin extension resistances.

Figure 1A:
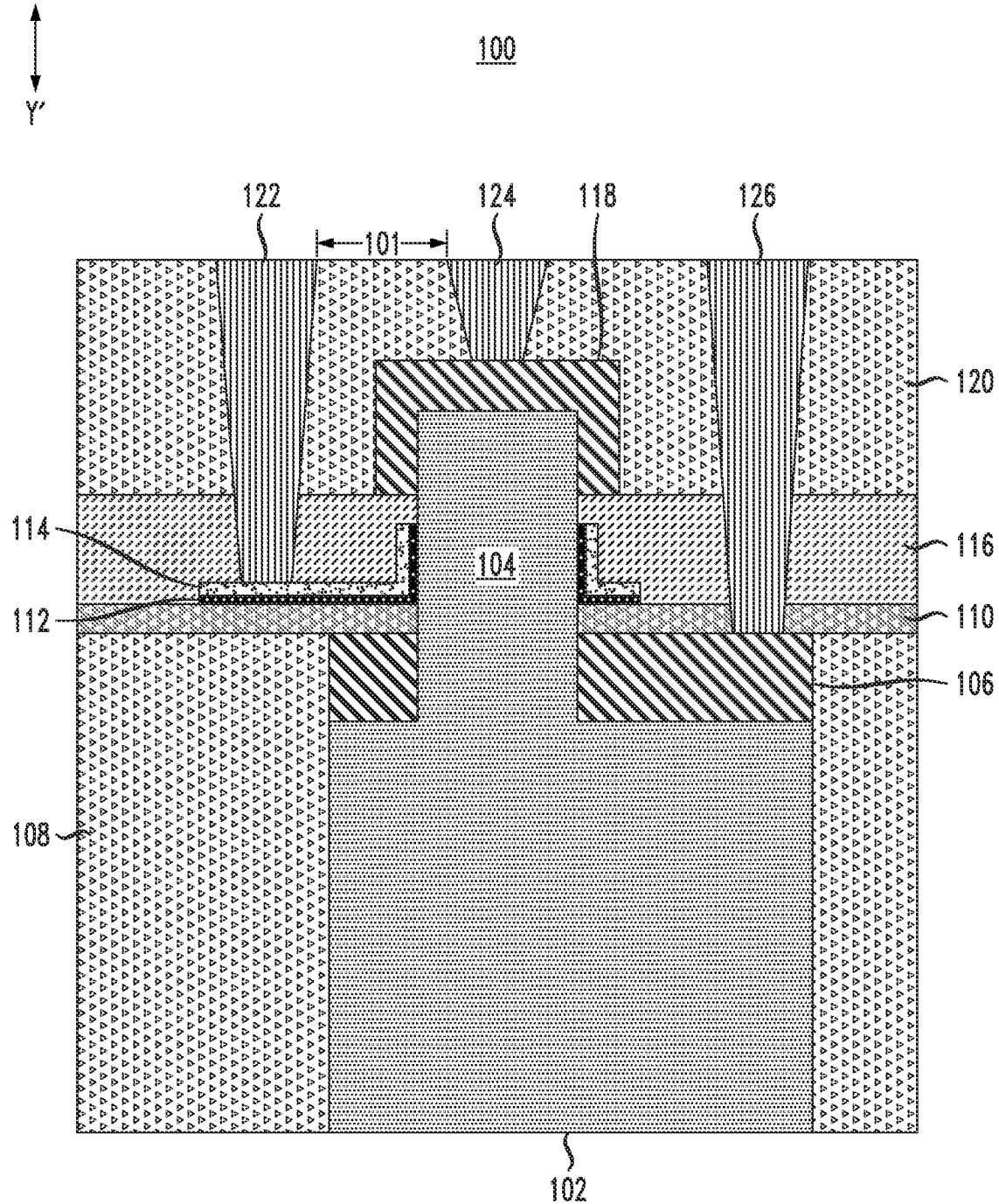
FIG. 1A depicts a side cross-sectional view of a vertical field-effect transistor structure with an L-shaped gate configuration, according to an embodiment of the present invention.

FIG. 1A shows a cross-sectional view 100 of a VFET with an L-shaped gate configuration. The FIG. 1A VFET includes a substrate 102, a fin 104, a bottom source/drain region 106, a shallow trench isolation (STI) layer 108 surrounding the substrate 102 and bottom source/drain region 106, a bottom spacer 110, a gate dielectric layer 112, a gate conductor layer 114, a top spacer 116, a top source/drain region 118, an interlayer dielectric (ILD) layer 120, a gate contact 122, a top source/drain contact 124, and a bottom source/drain contact 126. The cross-sectional view 100 of FIG. 1A is taken along or parallel to the fin 104. As illustrated in FIG. 1A, the gate of the VFET (e.g., gate dielectric layer 112 and gate conductor layer 114) has an "L-shaped" configuration.

Figure 2:
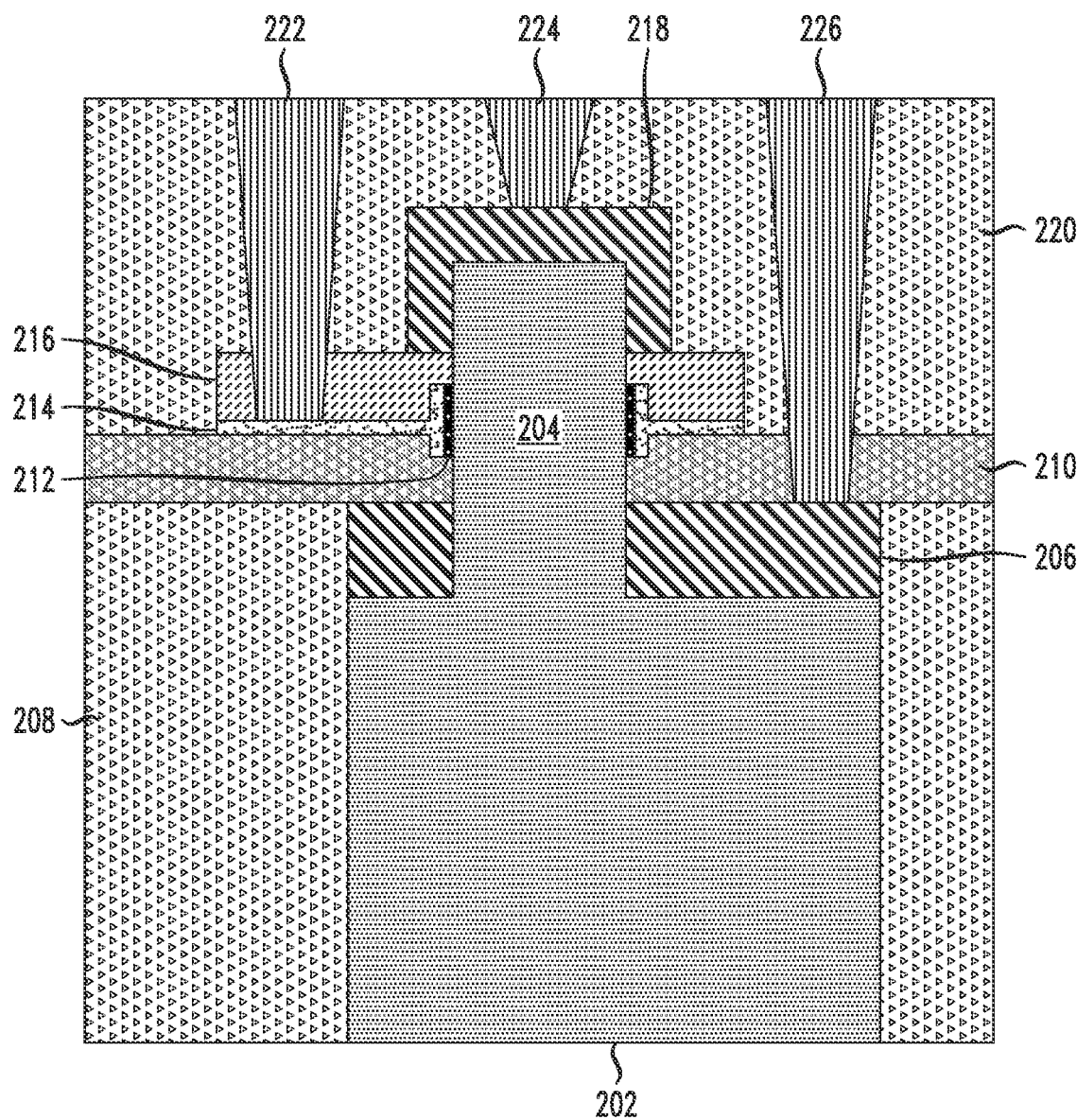
FIG. 2 depicts a side cross-sectional view of a vertical field-effect transistor structure with a T-shaped gate configuration, according to an embodiment of the present invention.

FIG. 2 shows a cross-sectional view 200 of a VFET structure with a T-shaped gate configuration. The FIG. 2 VFET, similar to the FIG. 1A VFET, includes a substrate 202, a fin 204, a bottom source/drain region 206, an STI layer 208 surrounding the substrate 202 and bottom source/drain region 206, a bottom spacer 210, a gate dielectric layer 212, a gate conductor layer 214, a top spacer 216, a top source/drain region 218, an ILD layer 220, a gate contact 222, a top source/drain contact 224, and a bottom source/drain contact 226. The cross-sectional view 200 of FIG. 2, similar to the cross-sectional view 100 of FIG. 1A, is taken along or parallel to the fin 204. As will be described in further detail below, the gate conductor layer 214 may in some embodiments include first and second portions. As illustrated in FIG. 2, the gate of the VFET (e.g., gate dielectric layer 212 and gate conductor layer 214) has a "T-shaped" configuration.

The T-shaped gate configuration advantageously allows for flexible design of Cs and Cd by changing the spacing of the gate to the top and bottom contacts without changing the parasitic fin extension resistances. In some embodiments, optimal ranges for the thickness of the bottom and top spacers may be derived from: (Cd+Cs) min=2*Cd=2*Cs=$\varepsilon$*$L_{fin}$*($A_{top}/T_{top}$+$A_{bottom}/T_{bottom}$)min, where $A_{top}$ denotes the area of the top spacer overlapped between the top source/drain region (e.g., the top epi) and the gate, $T_{top}$ denotes the vertical thickness of the top spacer, $A_{bottom}$ denotes the area of the bottom spacer overlapped between the bottom source/drain region (e.g., the bottom epi) and the gate, and $T_{bottom}$ denotes the vertical thickness of the bottom spacer. In some embodiments, $A_{top}=\frac{1}{2}*A_{bottom}$, and $T_{top}+T_{bottom}=21$ nm, therefore giving optimal thicknesses of $T_{top}=7$ nm and $T_{bottom}=14$ nm. As will be described below, the use of these thickness values in the T-shaped gate VTFET of FIG. 2 leads to a reduction in parasitic capacitance relative to the L-shaped gate VTFET of FIG. 1A.

In the below calculations for the parasitic capacitance reduction, it is assumed that the gate length or $L_{gate}$ (in direction Y-Y') is 15 nm for both the FIG. 1A and FIG. 2 VFETs, where $L_{gate}$ represents the height of the gate conductor layers 114/214 that are adjacent to sidewalls of the fins 104. For the FIG. 1A VFET, it is further assumed that the thickness (in direction Y-Y') of the bottom spacer 110 is 6 nm, and that the thickness (in direction Y-Y') of the top spacer 116 that is "above" the top surface of the gate dielectric layer 112 and gate conductor layer 114 is 8 nm. For the FIG. 2 VFET, it is further assumed that the thickness (in direction Y-Y') of the bottom spacer 210 is 14 nm and that the thickness of the top spacer 216 that is "above" the top surface of the gate dielectric layer 212 and gate conductor layer 214 is 7 nm. As will be described in further detail below, the T-shaped gate configuration of the FIG. 2 VFET allows for optimally tuning these thicknesses. For both the FIG. 1A VFET and the FIG. 2 VFET, it is assumed that the thicknesses (in direction Y-Y') of the gate conductor layers 114 and 214 that extend outward towards the gate contacts 122 and 222 (also referred to as an adherent layer or tungsten (W) liner) is 8 nm. Distance 101 between top epi contact to gate electrode, also referred to as d1, is illustrated in FIG. 1A, and it is assumed that the spacer distance between the edge of top epi and gate electrode is (0.5*d1).

The parasitic capacitance, or $C_{par}$, may be determined according to the equation:

$$\varepsilon * L_{fin} * (A_{top}/T_{top} + A_{bottom}/T_{bottom}).$$

For the L-shaped gate configuration VFET of FIG. 1A, $A_{top}$=0.5*d1, $T_{top}$=15 nm, $A_{bottom}$=d1, and $T_{bottom}$=6 nm. $T_{top}$ is computed as the 8 nm thickness of the top spacer 116 above the gate dielectric layer 112 and gate conductor layer 114 plus the 15 nm $L_{gate}$ minus the 8 nm thickness of the W liner. Thus, $C_{par}$ for the L-shaped gate configuration VFET of FIG. 1A is: $\varepsilon * L_{fin} * 0.2 * d1$.

For the T-shaped gate configuration VFET of FIG. 2, $A_{top}$=0.5*d1, $T_{top}$=7 nm, $A_{bottom}$=d1, and $T_{bottom}$=14 nm. Thus, $C_{par}$ for the T-shaped gate configuration VFET of FIG. 2 is: $\varepsilon * L_{fin} * 0.14 * d1$, or 66% of that $C_{par}$ for the L-shaped gate configuration VFET of FIG. 1A.

Figure 1B:
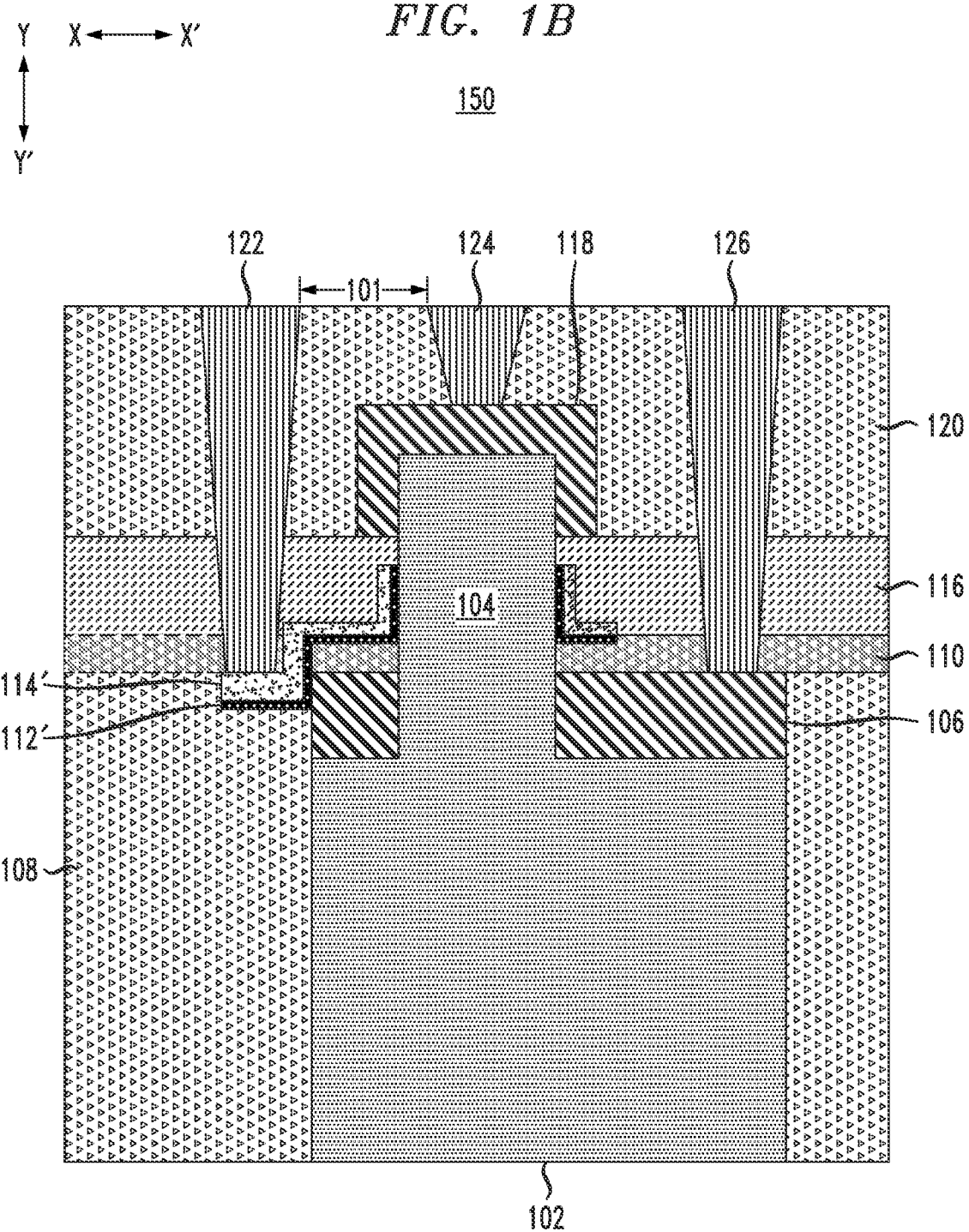
FIG. 1B depicts a side cross-sectional view of a vertical field-effect transistor structure with an L-shaped gate configuration and bottom spacer and isolation region losses, according to an embodiment of the present invention.

Due to spacer and STI loss during indispensable gate stack deposition pre-clean, which leads to additional gate electrode to bottom epi overlap, the amount of Cgs is increased by 77% in a conventional VFET. Such spacer and STI loss is illustrated in FIG. 1B, which shows how the bottom spacer 110 and STI 108 loss below gate contact 122 results in alteration of the gate stack structure. In the side cross-sectional view 150 of FIG. 1B, the same reference numerals are used as for FIG. 1A to denote similar elements, with the exception of 112' and 114' for the gate dielectric layer and gate conductor layer, respectively, to denote the different shape of the gate stack due to the bottom spacer 110 and STI 108 loss in the area below gate contact 122.

Theoretical performance analysis shows reduction in parasitic capacitance may lead to improvement of over frequency at Iso power by 11% using the techniques described herein.

Filling a thin bottom spacer for an L-shaped gate VFET is challenging in terms of uniformity control. In some cases, for example, there is no spacer material deposited which results in a very large parasitic capacitance. Due to STI loss, there may be overlap between contacts and the active region. With the T-shaped gate configuration used in illustrative embodiments, it is possible to add additional bottom spacer thickness for better thickness control relative to L-shaped gate VFETs. Thus, the T-shaped gate configuration used in illustrative embodiments can significantly reduce parasitic overlay capacitances between the gate and the bottom source/drain region (also referred to as a bottom epitaxial or epi layer) of the VFET. The T-shaped gate configuration can also improve the performance of the source/drain overlay.

The flexibility for Cd and Cs design for different cases where gate-drain overlay and gate-source overlay are different also provides advantages. Further, the T-shaped gate configuration may be used for tunnel FETs in addition to MOS transistors.

An illustrative process for forming the T-shaped gate VTFET of FIG. 2 will now be described in further detail with respect to FIGS. 3-19.

Figure 3:
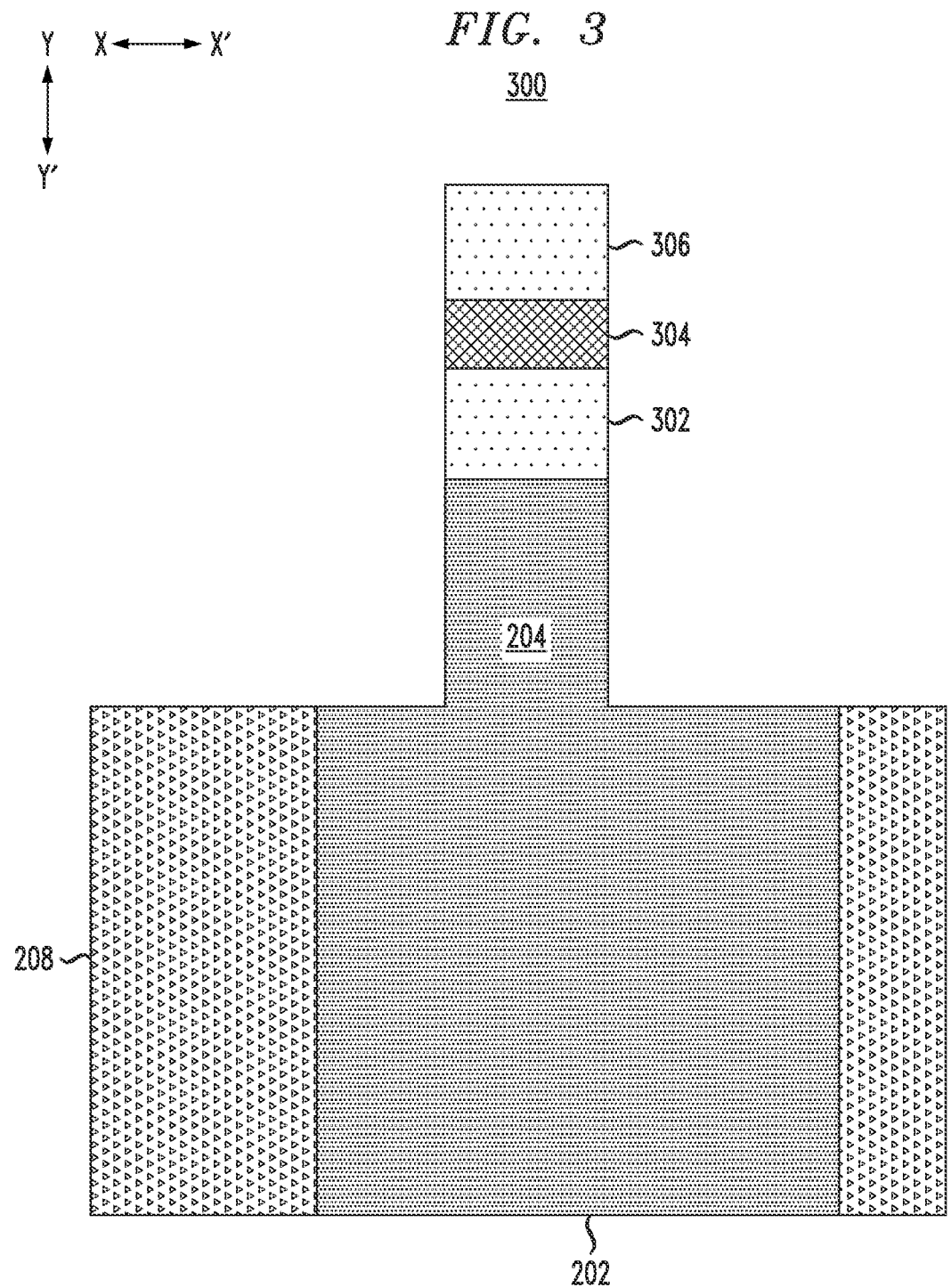
FIG. 3 depicts a side cross-sectional view of a semiconductor structure after fin etching using a nitride-oxide-nitride hard mask, according to an embodiment of the present invention.

FIG. 3 shows a cross-sectional view of a structure including the substrate 202, the fin 204, the STI layer 208 surrounding the substrate 202, and a nitride-oxide-nitride hard mask including a nitride layer 302, oxide layer 304 and nitride layer 306.

The substrate 202 may comprise a semiconductor substrate formed of silicon (Si), although other suitable materials may be used. For example, the substrate 202 can include any suitable substrate structure, e.g., a bulk semiconductor, a semiconductor-on-insulator (SOI) substrate, etc. In one example, the substrate 202 can include a silicon-containing material. Illustrative examples of Si-containing materials suitable for the substrate 102 can include, but are not limited to, Si, silicon germanium (SiGe), carbon-doped silicon germanium carbide (SiGe:C), carbon-doped silicon (Si:C), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), germanium tin (GeSn), etc.

The substrate 202 may have a vertical thickness or height (in direction Y-Y') ranging from 0.1 millimeters (mm) to 5 mm. The substrate 202 may have a horizontal thickness or width (in direction X-X') selected as desired for a particular application, such as based on a desired number of fins or resulting VFETs or other features to be formed thereon. It should be appreciated that while FIGS. 3-19 are described with respect to forming a single VFET, multiple VFETs may be formed over the substrate 202 in other embodiments.

The fin 204 may be formed using lithography followed by etching (e.g., reactive-ion etching (RIE)). Other suitable techniques, such as sidewall image transfer (SIT), self-aligned double patterning (SADP), self-aligned multiple patterning (SAMP), self-aligned quadruple patterning (SAQP) can be used. The fin 204 may be formed of the same material as the substrate 202. For example, both the fin 204 and the substrate 202 may be formed of silicon (Si). Alternatively, the fin 204 may be formed of different material from the substrate 202 by first epitaxially growing a different material on the substrate 202, and then perform patterning to form the fin 204. For example, the fin 204 can be silicon germanium (SiGe) while the substrate 202 can be Si. The fin 204 may have a vertical thickness or height (in direction Y-Y') ranging from 20 nm to 200 nm and a horizontal thickness or width (in direction X-X') ranging from 3 nm to 15 nm. It should be noted that the dimensions of the fin 204 (as well as the dimensions of other features and layers described herein) may vary as desired for a particular application, and are not limited to the specific ranges of dimensions provided.

The STI layer 208, also referred to as isolation region 208, may be formed of a dielectric material such as silicon oxide ($SiO_x$), silicon nitride (SiN), silicon oxycarbide (SiOC), silicon oxynitride (SiON), or any other suitable dielectric materials. The vertical thickness or height (in direction Y-Y') of the STI layer 208 matches that of the substrate 202, and the horizontal thickness or width (in direction X-X') may vary as desired to provide the requisite isolation of a resulting VFET formed from the FIG. 3 structure.

The nitride-oxide-nitride hard mask comprising nitride layer 302, oxide layer 304 and nitride layer 306 may be used for patterning and forming the fin 204 as described above. The nitride layers 302 and 304 may be formed of SiN, while the oxide layer 304 may be formed of silicon oxide ($SiO_X$) or silicon dioxide ($SiO_2$). The horizontal thickness or width (in direction X-X') of the nitride layer 302, oxide layer 304 and nitride layer 306 matches that of the underlying fin 204. The nitride layer 302 may have a vertical thickness or height (in direction Y-Y') in the range of 1 nm to 100 nm. The oxide layer 304 may have a vertical thickness or height (in direction Y-Y') in the range of 1 nm to 100 nm. The nitride layer 306 may have a vertical thickness or height (in direction Y-Y') in the range of 1 nm to 100 nm.

Figure 4:
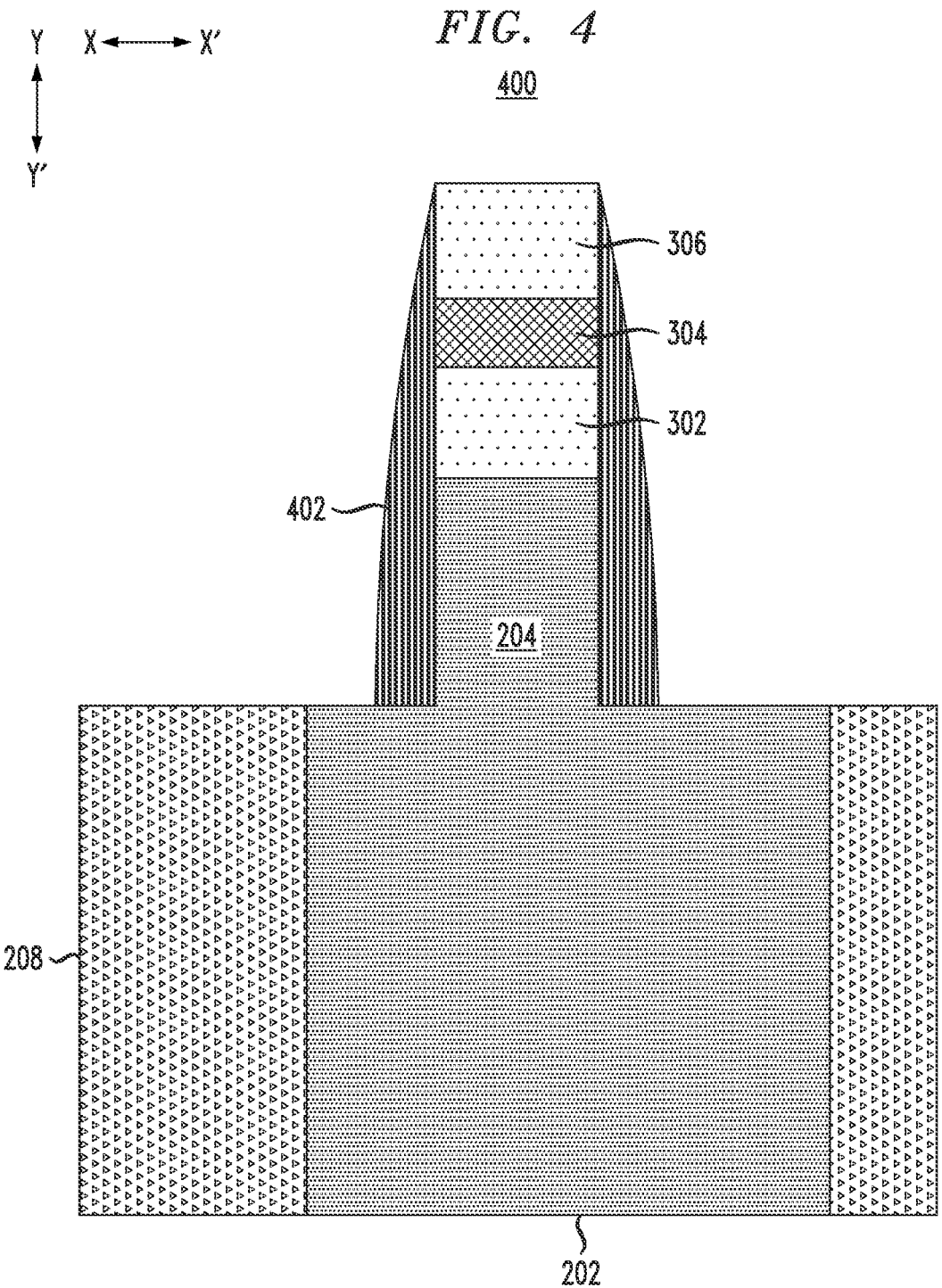
FIG. 4 depicts a side cross-sectional view of the FIG. 3 structure following formation of a spacer, according to an embodiment of the present invention.

FIG. 4 shows a side cross-sectional view 400 of the FIG. 3 structure following formation of a spacer 402 on sidewalls of the fin 204 and the nitride-oxide-nitride hard mask. The spacer 402 may be formed by conformal deposition of a dielectric material such as SiN, silicon boron carbide nitride (SiBCN) or SiC by chemical vapor deposition (CVD), followed by ME. The spacer 402 has a varying width or horizontal thickness (in direction X-X'), with a widest portion proximate the top surface of the substrate 202 in the range of 1 nm to 30 nm that narrows towards the top surface of the nitride layer 306.

Figure 5:
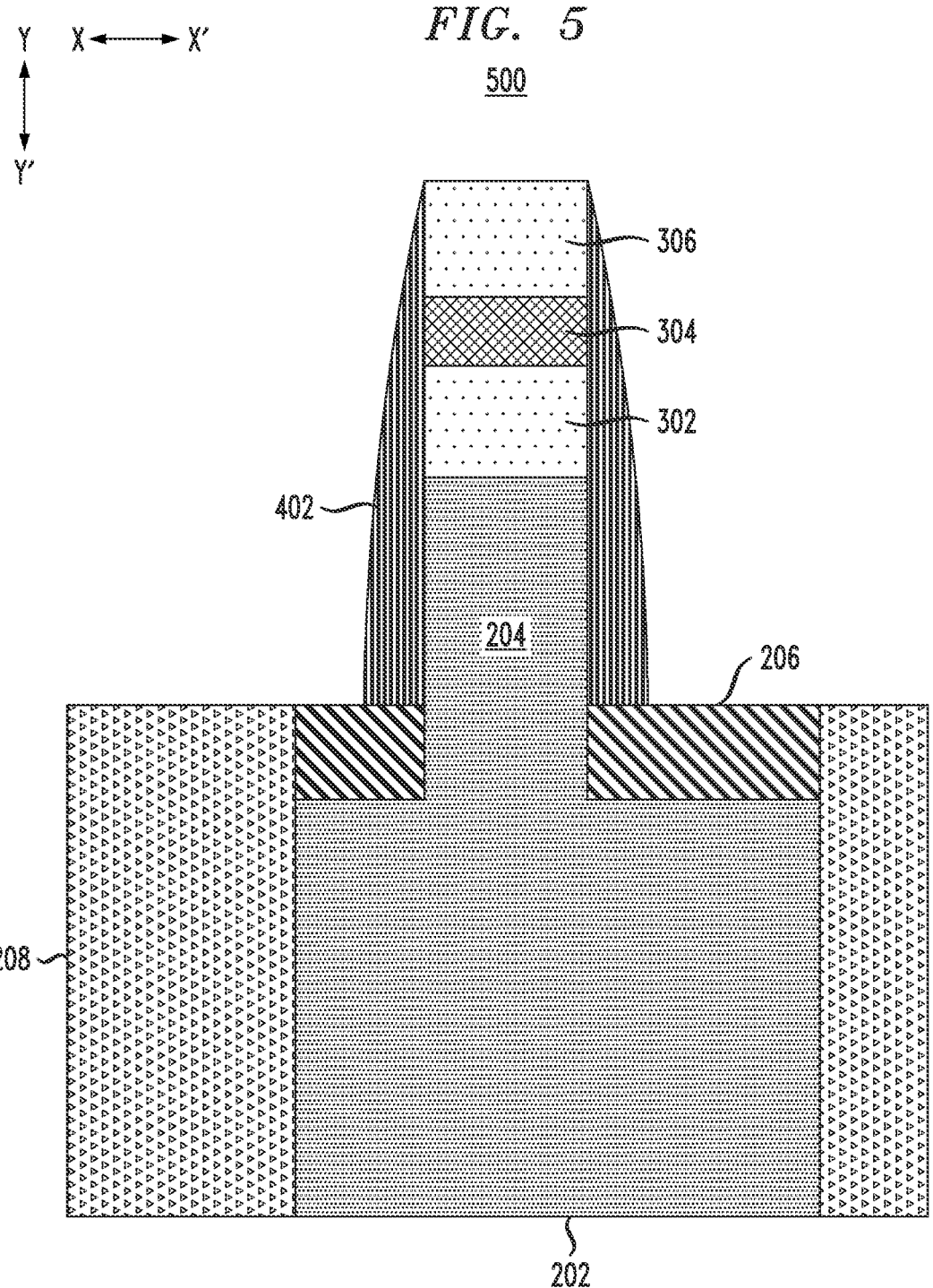
FIG. 5 depicts a side cross-sectional view of the FIG. 4 structure following formation of a bottom source/drain region, according to an embodiment of the present invention.

FIG. 5 shows a side cross-sectional view 500 of the FIG. 4 structure following formation of a bottom source/drain region 206. The bottom source/drain region 206, also referred to herein as a bottom junction 206, may be formed by etching the substrate 202 (e.g., using RIE) followed by epitaxial growth. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

The bottom source/drain region 206 may alternatively be formed by doping a portion of the substrate 202, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

Figure 6:
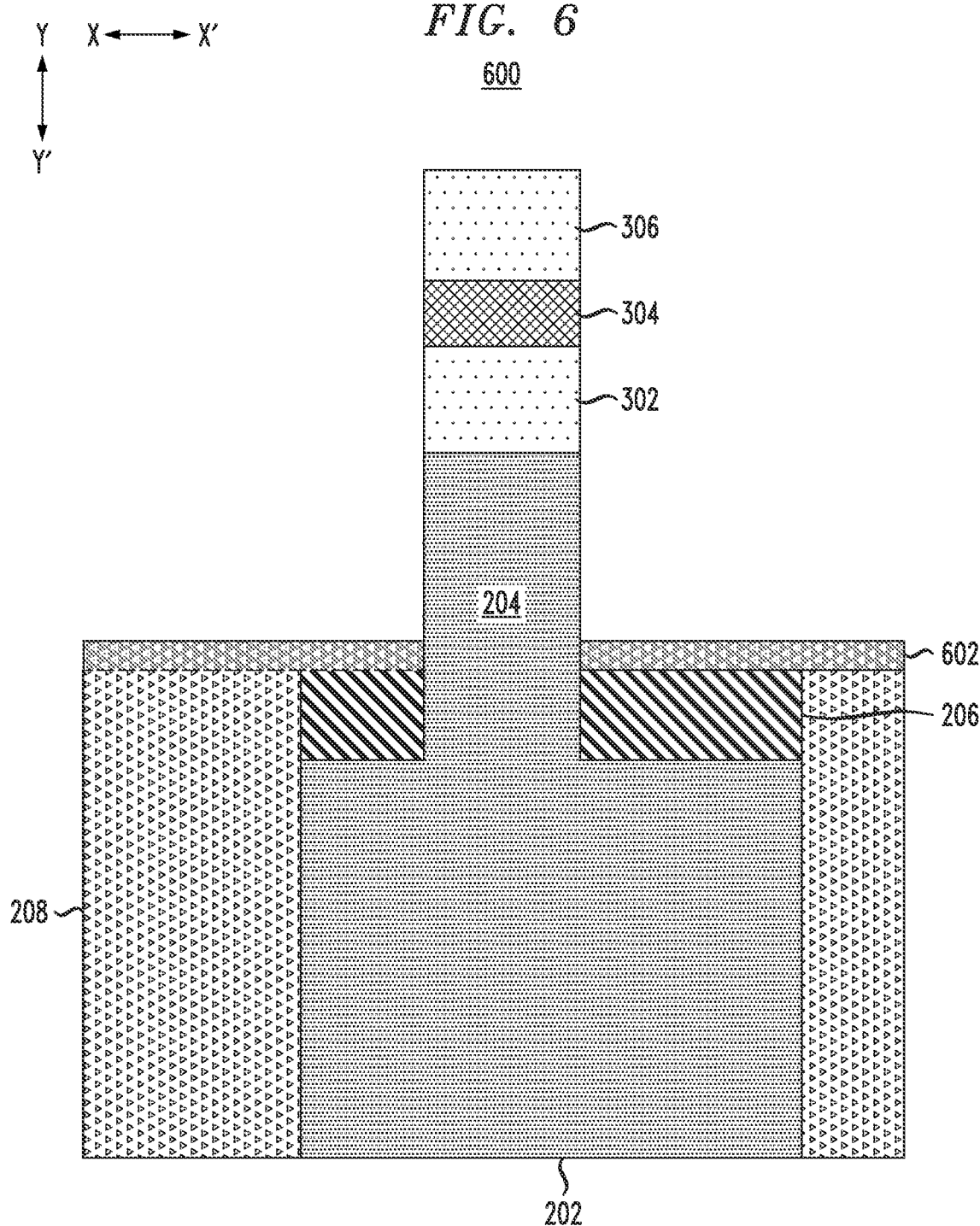
FIG. 6 depicts a side cross-sectional view of the FIG. 5 structure following formation of bottom spacer material, according to an embodiment of the present invention.

FIG. 6 shows a side cross-sectional view 600 of the FIG. 5 structure following formation of bottom spacer material 602. The bottom spacer material 602 may be formed using non-conformal deposition and etch-back processing (e.g., physical vapor deposition (PVD), high density plasma (HDP) deposition, etc.). The bottom spacer material 602 may be formed of $SiO_2$, SiN, silicon carbide oxide (SiCO), SiBCN, etc., although other suitable materials may be used. The bottom spacer material 602 may have a height or vertical thickness (in direction Y-Y') in the range of 1 nm to 30 nm. As will be described in further detail below, the bottom spacer material 602 forms a part of the bottom spacer 210 in the resulting VFET structure.

Figure 7:
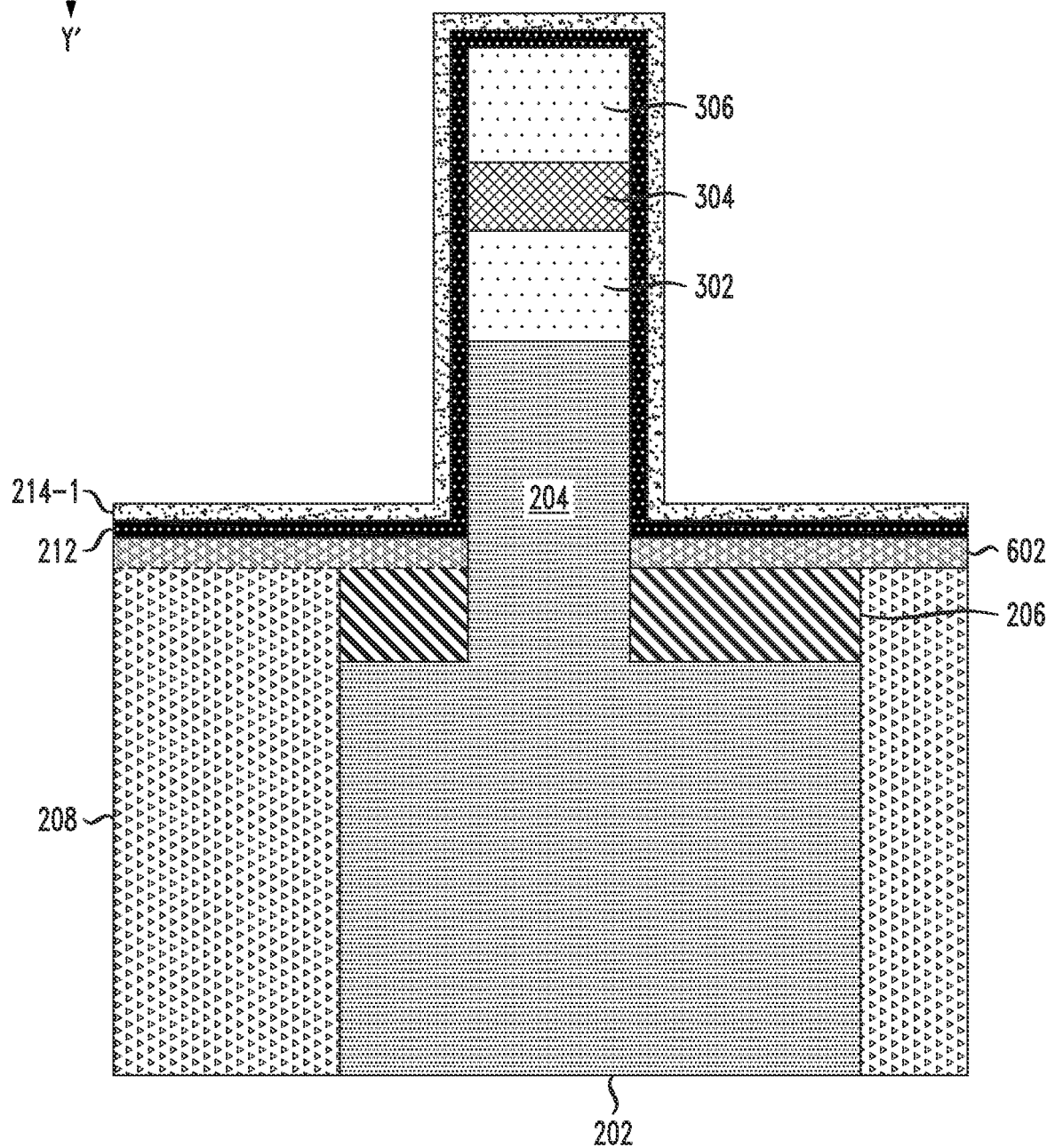
FIG. 7 depicts a side cross-sectional view of the FIG. 6 structure following formation of gate stack materials, according to an embodiment of the present invention.

FIG. 7 shows a side cross-sectional view 700 of the FIG. 6 structure following formation of gate stack materials include the gate dielectric layer 212 and a gate conductor layer 214-1. As noted above, the gate conductor 214 of the resulting VFET may have different portions. The gate conductor layer 214-1, after additional processing described below, provides a first portion of the gate conductor 214 (e.g., a "top" of the T-shaped gate configuration). A second portion of the gate conductor 214 (e.g., a "base" of the T-shaped gate configuration) may be formed as described in further detail below with respect to gate metal 214-2.

The gate dielectric layer 212 may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer 212 may have a uniform thickness in the range of 1 nm to 4 nm.

The gate conductor layer 214-1 may include a metal gate or work function metal (WFM). In some embodiments, the gate conductor layer 214-1 is formed using atomic layer deposition (ALD) or another suitable process. For nFET devices, the WFM for the gate conductor layer 214-1 may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layer 214-1 as desired. The gate conductor layer 214-1 may have a uniform thickness in the range of 4 nm to 20 nm.

Figure 8:
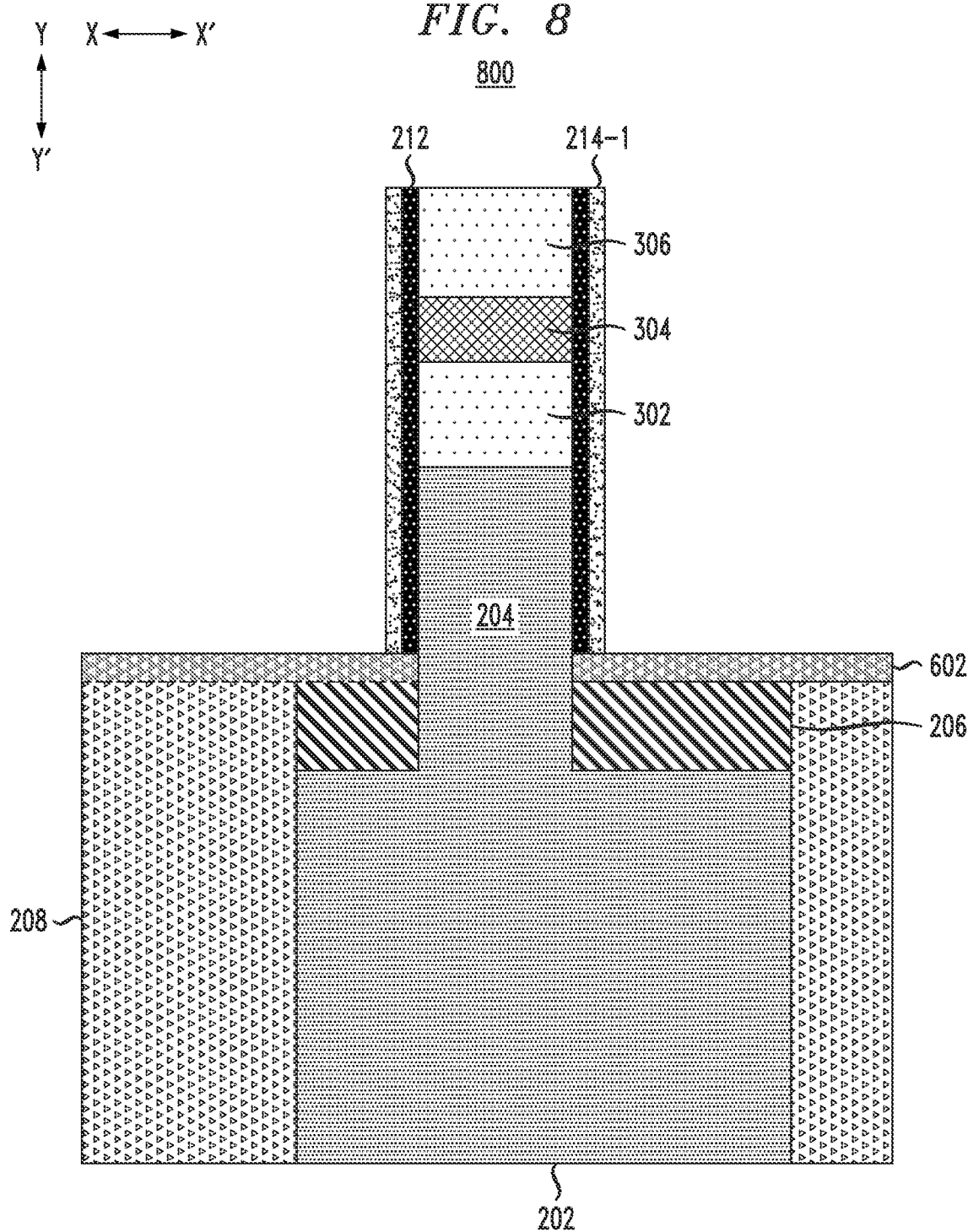
FIG. 8 depicts a side cross-sectional view of the FIG. 7 structure following a directional etch of the gate stack materials, according to an embodiment of the present invention.

FIG. 8 shows a side cross-sectional view 800 of the FIG. 7 structure following a directional etch of the gate stack materials without a mask, which removes portions of the gate dielectric layer 212 and gate conductor layer 214 to expose a top surface of the bottom spacer material 602 and a top surface of the nitride layer 306 as illustrated.

Figure 9:
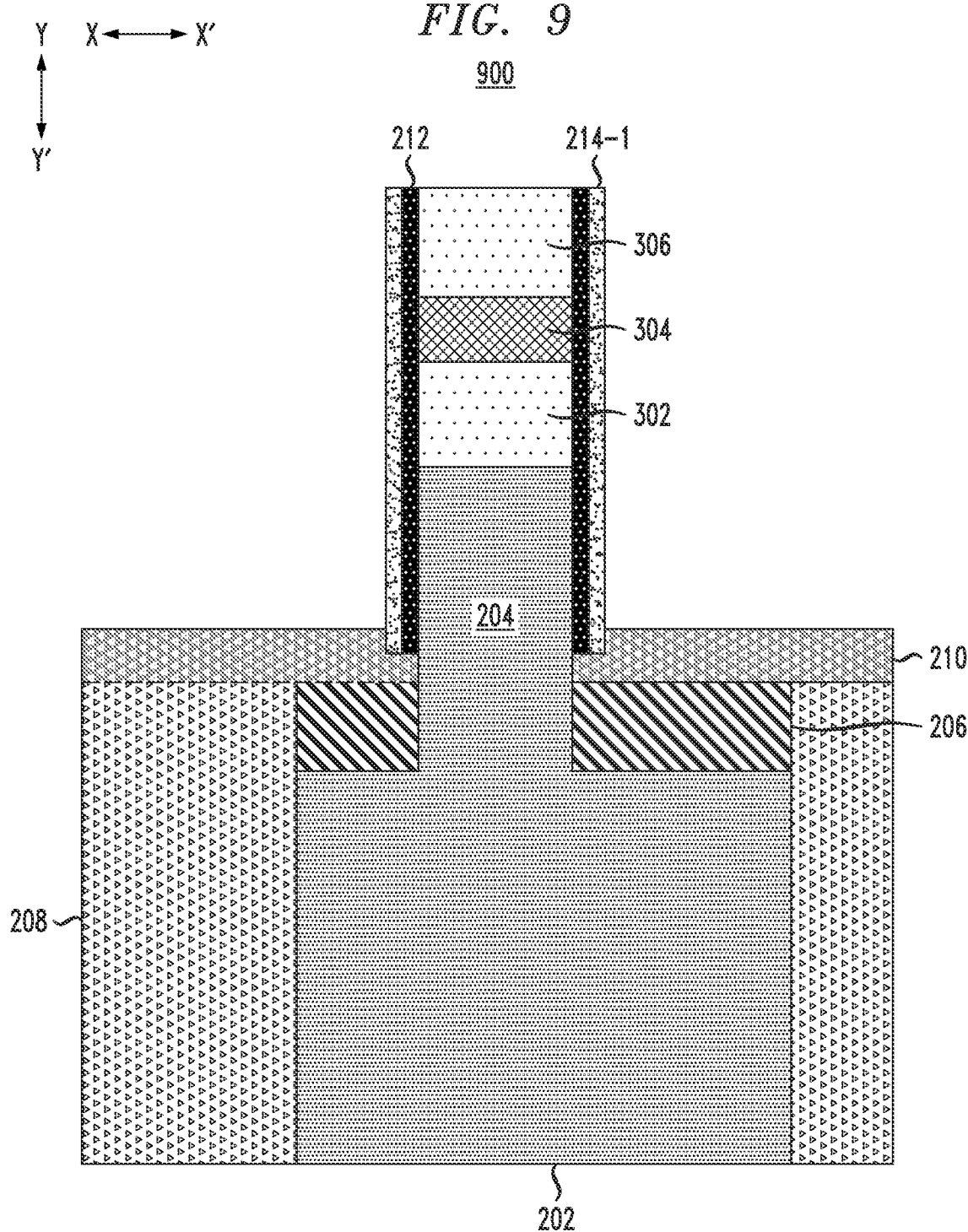
FIG. 9 depicts a side cross-sectional view of the FIG. 8 structure following formation of additional bottom spacer material, according to an embodiment of the present invention.

FIG. 9 shows a side cross-sectional view 900 of the FIG. 8 structure following formation of additional bottom spacer material that, together with the bottom spacer material 602, provides the bottom spacer 210 in the resulting VFET. The additional spacer material may be formed using an anisotropic deposition process such as HDP CVD. The additional bottom spacer material may have a height or vertical thickness (in direction Y-Y') in the range of 5 nm to 8 nm. It should be noted that the T-shaped gate variation is dependent on this step. Variation in the amount of additional bottom spacer material formed in this step may be used to control where the "base" gate metal 214-2 extends outward from the "top" gate conductor layer 214-1 of the T-shaped gate structure.

Figure 10:
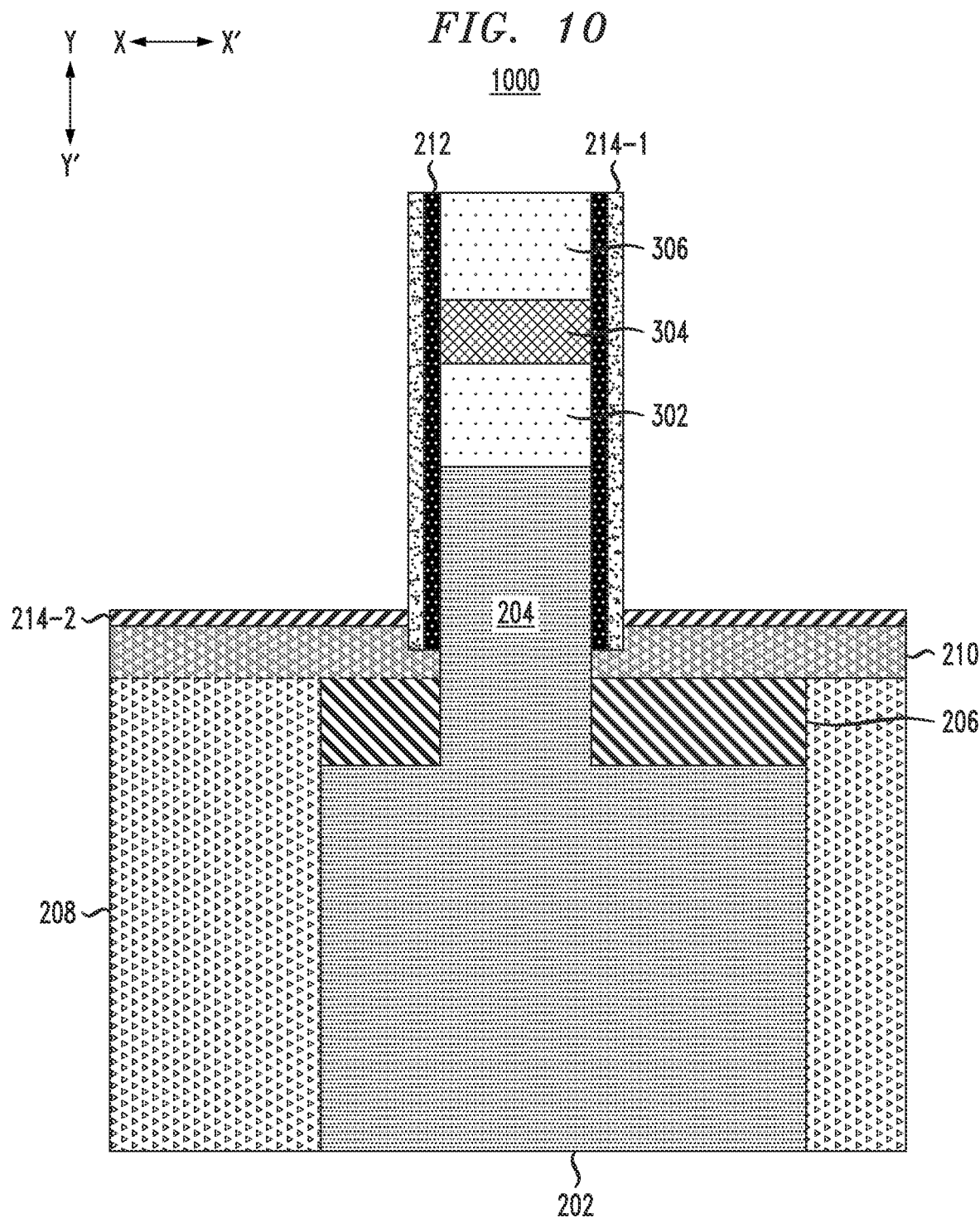
FIG. 10 depicts a side cross-sectional view of the FIG. 9 structure following formation of a gate metal, according to an embodiment of the present invention.

FIG. 10 shows a side cross-sectional view 1000 of the FIG. 9 structure following formation of the gate metal 214-2 that provides a second portion of the gate conductor layer 214. Advantageously, the gate metal 214-2 (which connects to the gate contact 222 as will be described in further detail below) is located in a "middle" of the sidewalls of the gate conductor layer 214-1. This increases the overlay distance between the gate and the bottom junction 206, thus reducing the parasitic capacitance. It should be noted that the gate metal 214-2 need not extend outwards from the exact "middle" of the sidewalls of the gate conductor layer 214-1. The exact location on the sidewalls of the gate conductor layer 214-1 from which the gate metal 214-2 extends may be controlled by adjusting the amount of the second portion of the bottom spacer material that is deposited.

The gate metal 214-2 may be formed using a conformal deposition and etch-back processing, or an anisotropic deposition process. The gate metal 214-2 may have a height or vertical thickness (in direction Y-Y') of 8 nm, or more generally in the range of 4 nm to 30 nm. The gate metal 214-2 may comprise tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. titanium aluminide ($Ti_3Al$), zirconium aluminide (ZrAl)), tantalum carbide (TaC), tantalum magnesium carbide (TaMgC), or any suitable combination of these materials.

Figure 11:
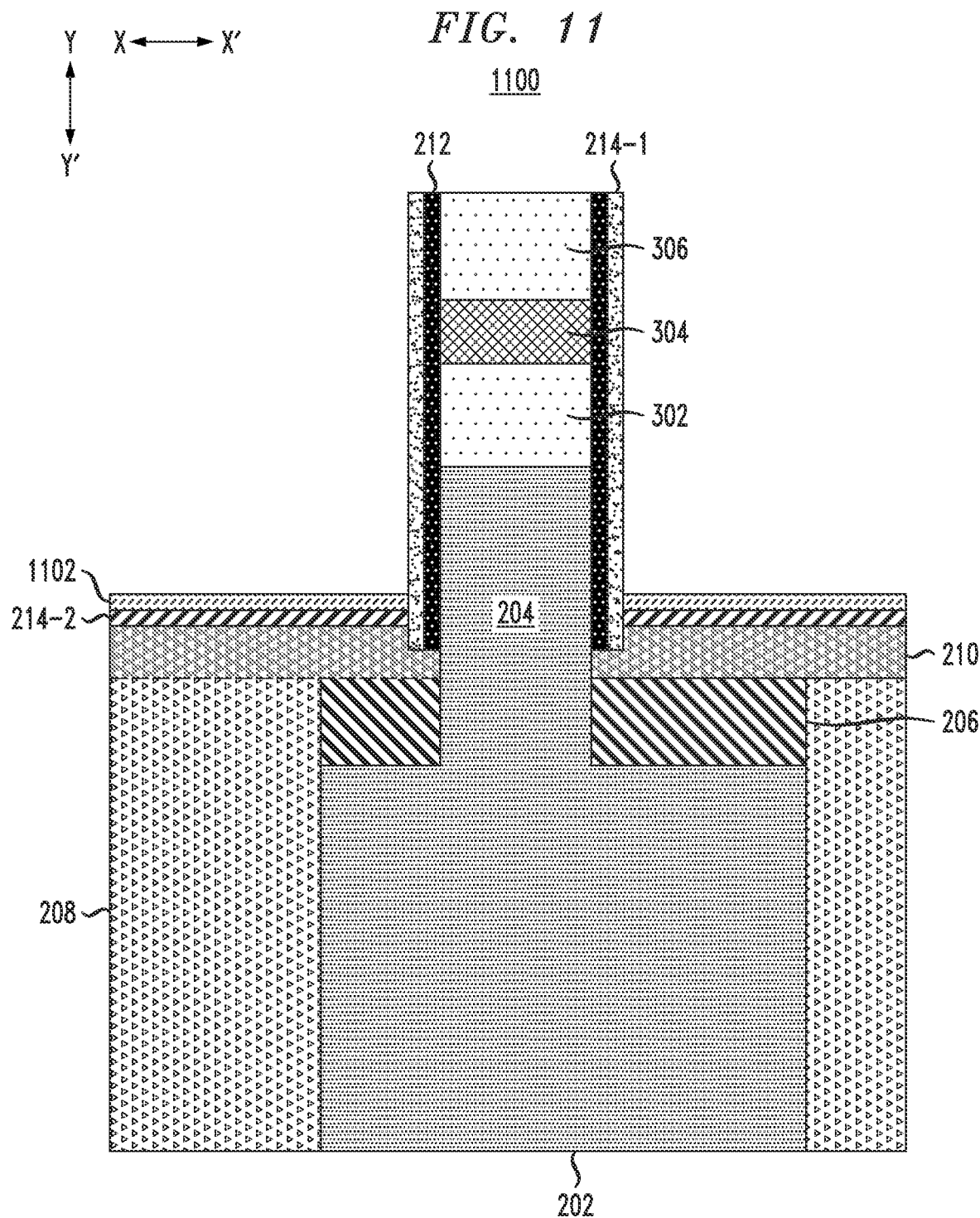
FIG. 11 depicts a side cross-sectional view of the FIG. 10 structure following formation of top spacer material, according to an embodiment of the present invention.

FIG. 11 shows a side cross-sectional view 1100 of the FIG. 10 structure following formation of top spacer material 1102. The top spacer material 1102 may be similar to the bottom spacer material 602. The top spacer material 1102 may be formed using HDP deposition. The top spacer material 1102 may have a height or vertical thickness (in direction Y-Y') in the range 2 nm to 30 nm.

Figure 12:
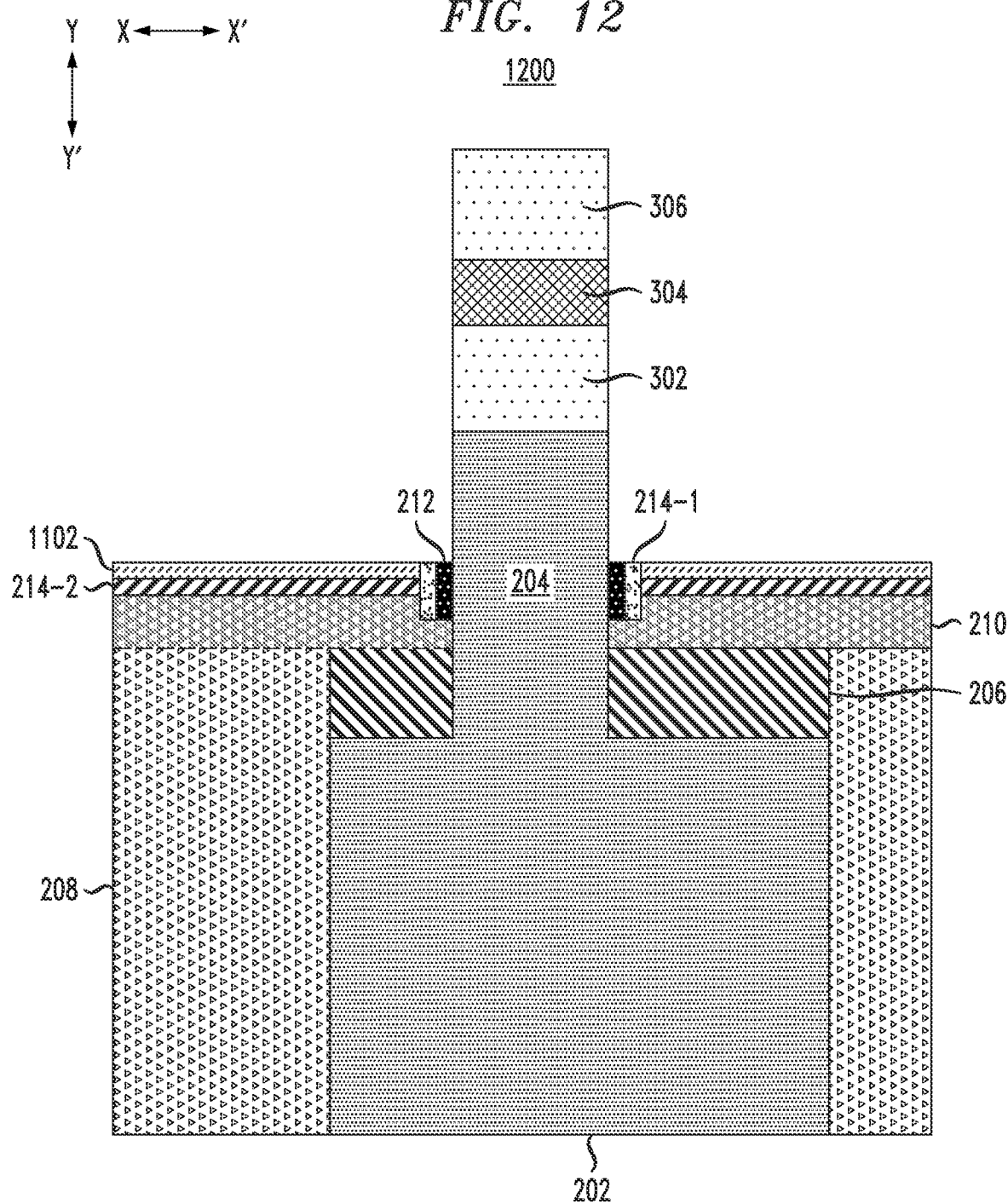
FIG. 12 depicts a side cross-sectional view of the FIG. 11 structure following recess of the gate stack materials, according to an embodiment of the present invention.

FIG. 12 shows a side cross-sectional view 1200 of the FIG. 11 structure following recess of the gate stack materials (e.g., the gate dielectric layer 212 and the gate conductor layer 214-1) to match a top surface of the top spacer material 1102. It should be noted that if the gate metal 214-2 is deposited everywhere, then the gate metal 214-2 may also be recessed. The gate stack materials may be recessed using a wet etching.

Figure 13:
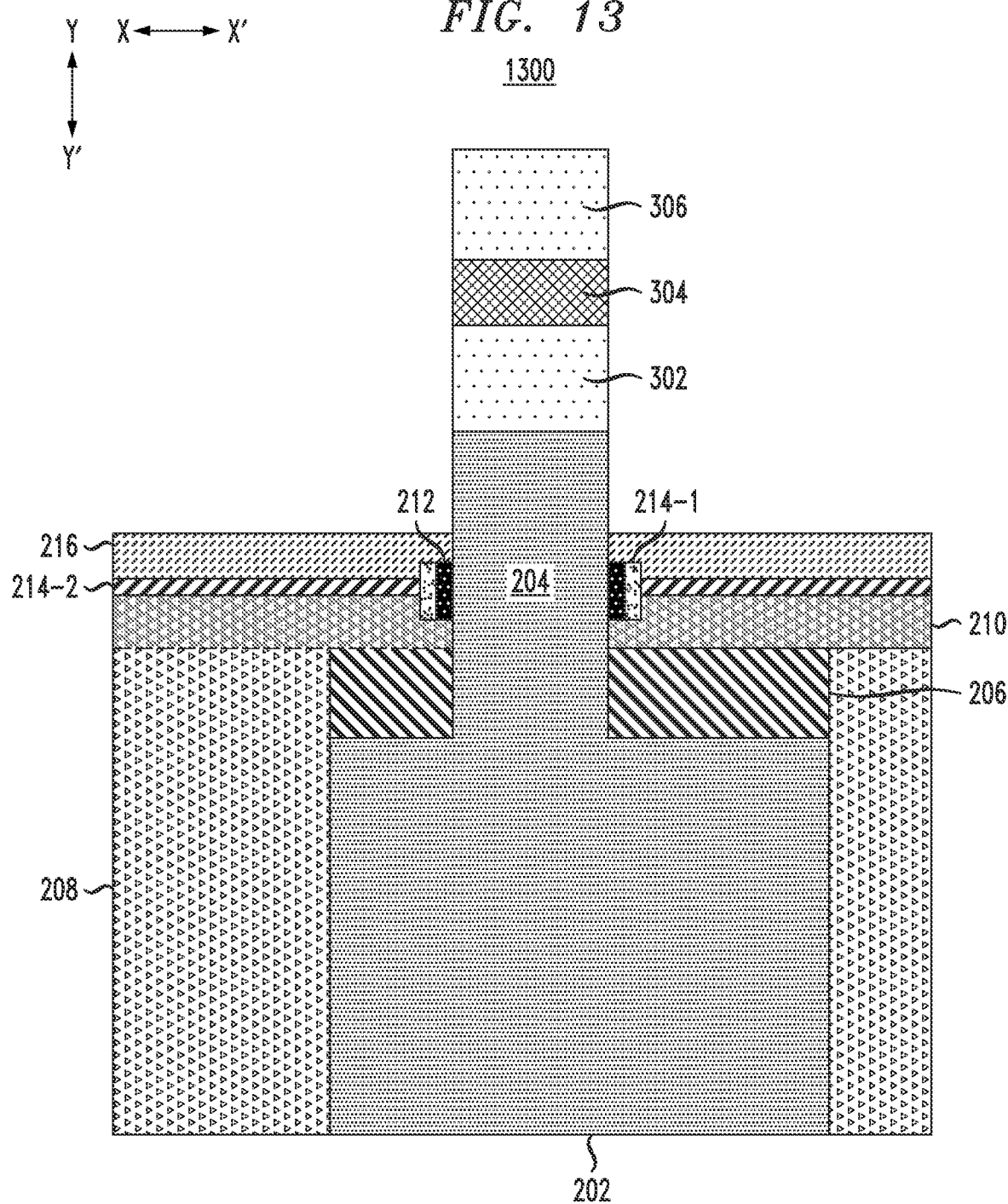
FIG. 13 depicts a side cross-sectional view of the FIG. 12 structure following formation of additional top spacer material, according to an embodiment of the present invention.

FIG. 13 shows a side cross-sectional view 1300 of the FIG. 12 structure following formation of additional top spacer material that, together with the top spacer material 1102, provides the top spacer 216 of the resulting VFET. The top spacer 216 may have a height or vertical thickness in the range of 2 nm to 30 nm.

Figure 14:
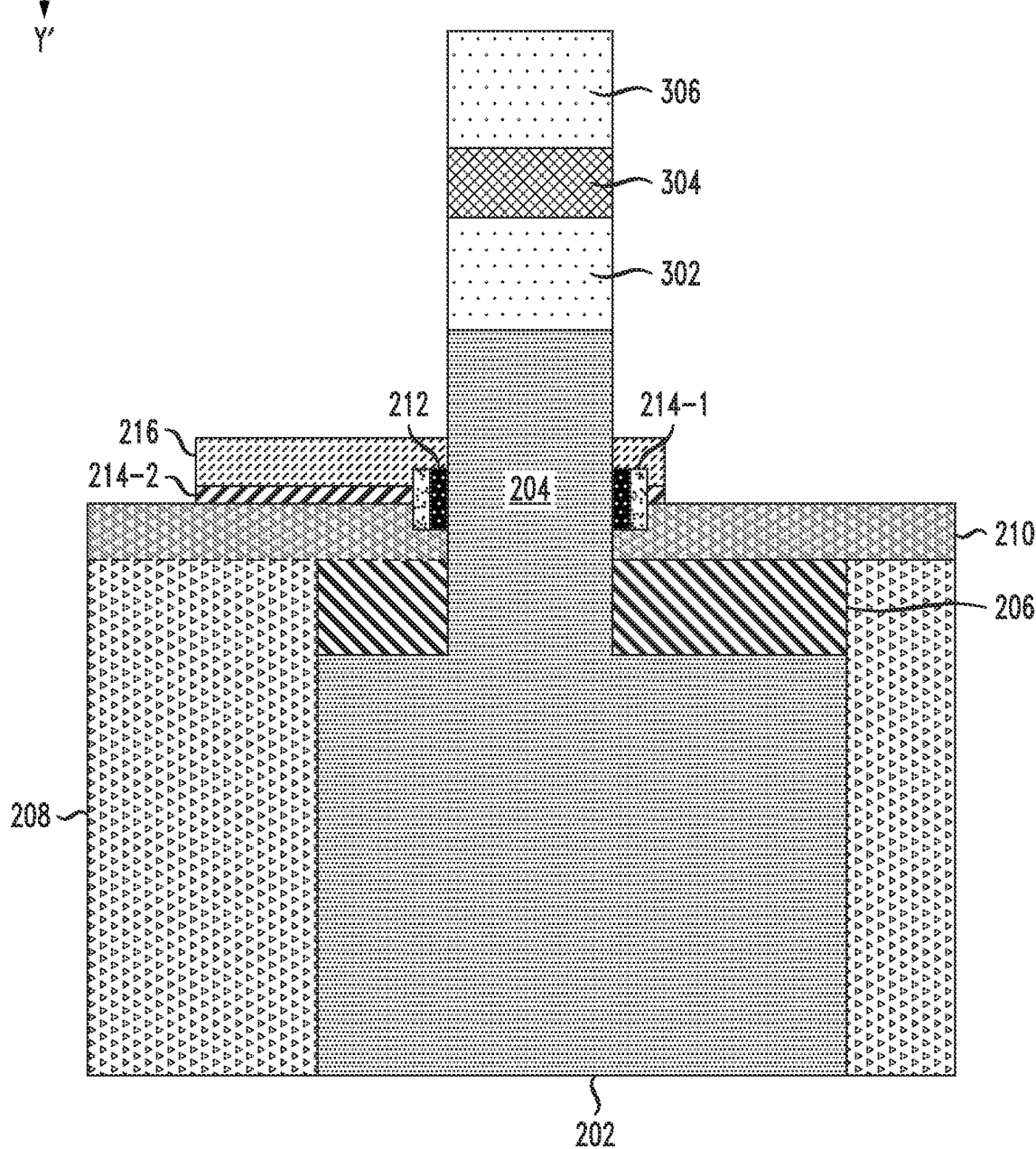
FIG. 14 depicts a side cross-sectional view of the FIG. 13 structure following a gate cut to provide device isolation, according to an embodiment of the present invention.

FIG. 14 shows a side cross-sectional view 1400 of the FIG. 13 structure following a gate cut to provide device isolation for the resulting VFET. The gate cut removes portions of the gate dielectric layer 212, the gate conductor layer 214-1, the gate metal 214-2 and the top spacer 216 as illustrated to disconnect the gate of the resulting VFET from other devices that may be formed on the substrate 202. The gate cut may be performed using lithography and etching.

Figure 15:
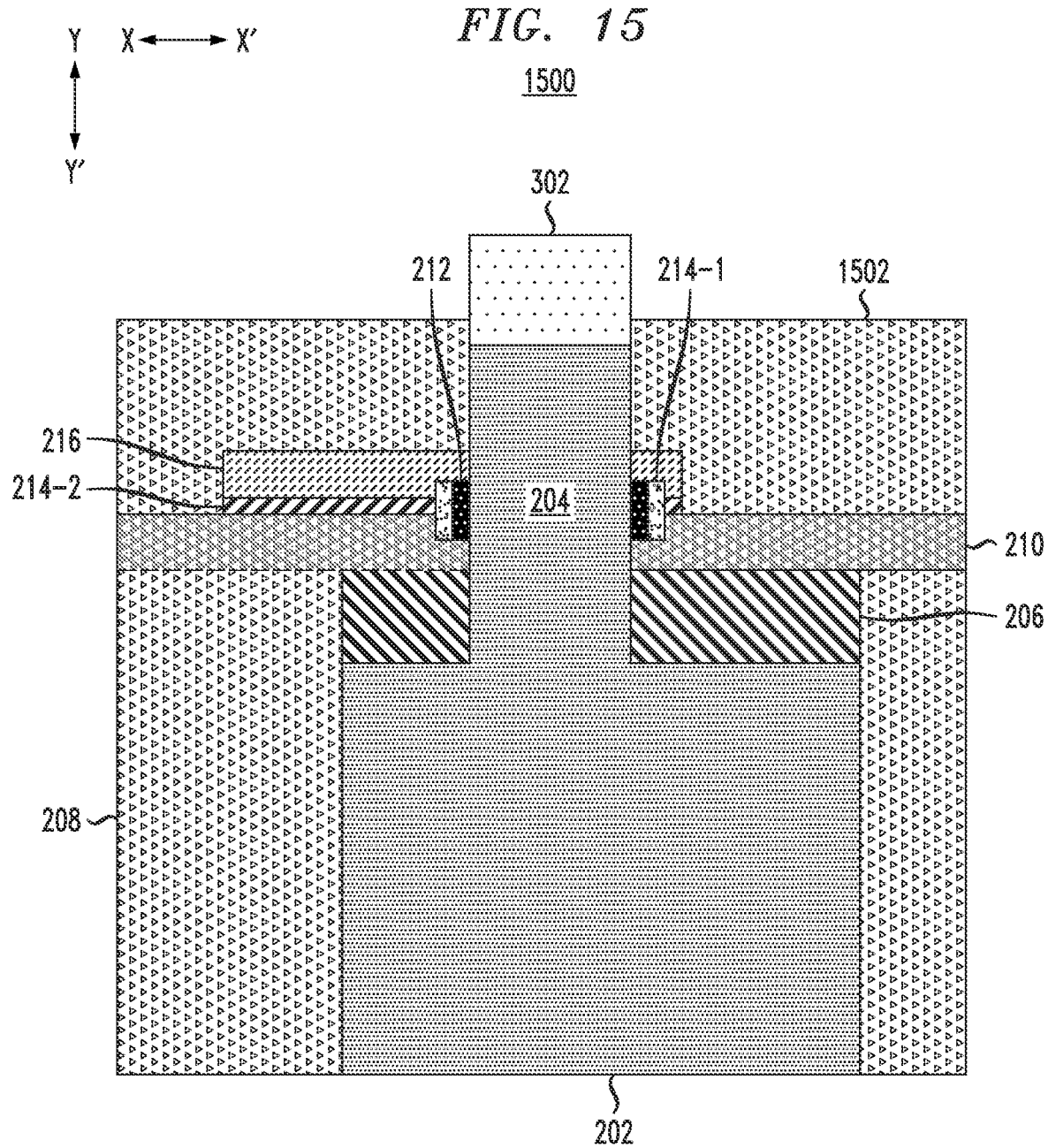
FIG. 15 depicts a side cross-sectional view of the FIG. 14 structure following formation of an interlayer dielectric material, according to an embodiment of the present invention.

FIG. 15 shows a side cross-sectional view 1500 of the FIG. 14 structure following formation of an ILD material 1502 (e.g, an oxide), and following a reveal that removes the nitride layer 306 and oxide layer 304. The ILD material 1502 may initially fill the structure, and the reveal may be performed using a wet etching or RIE to recess the ILD material 1502 below a top surface of the nitride layer 302 thereby removing the nitride layer 306 and oxide layer 304.

Figure 16:
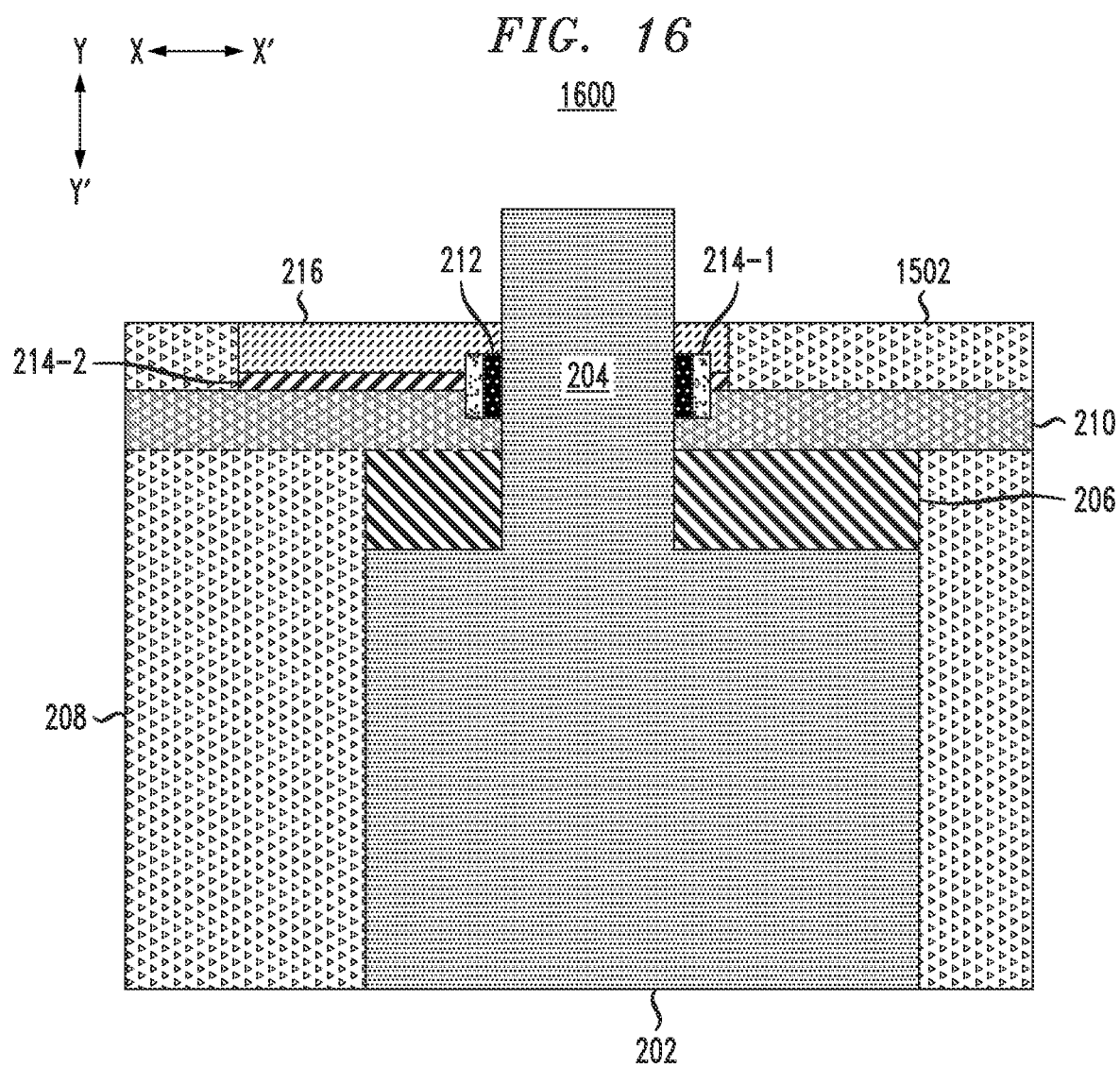
FIG. 16 depicts a side cross-sectional view of the FIG. 15 structure following removal of the remaining nitride mask and recess of the interlayer dielectric material, according to an embodiment of the present invention.

FIG. 16 shows a side cross-sectional view 1600 of the FIG. 15 structure following removal of the nitride layer 302 and recess of the oxide layer 1502. The nitride layer 302 may be removed using a hot phosphorus etch, and the oxide layer 1502 may be recessed to match a top surface of the top spacer 216 using a wet buffered hydrofluoric acid (BHF) etch.

Figure 17:
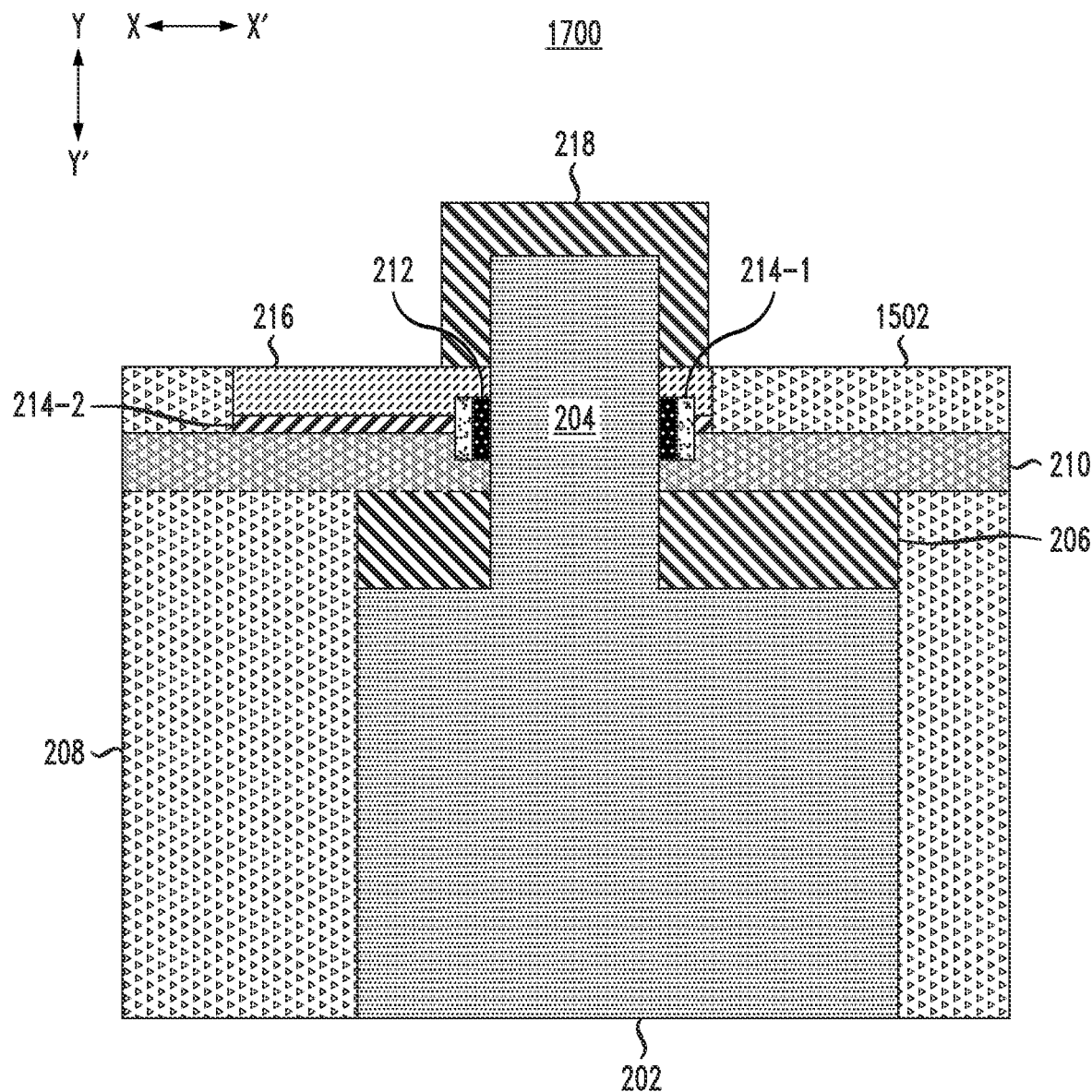
FIG. 17 depicts a side cross-sectional view of the FIG. 16 structure following formation of a top source/drain region, according to an embodiment of the present invention.

FIG. 17 shows a side cross-sectional view 1700 of the FIG. 16 structure following formation of the top source/drain region 218. The top source/drain region 218, also referred to herein as top junction 218, may be formed using processing similar to that described above with respect to the bottom source/drain region 206. The top source/drain region 218 may have a uniform thickness in the range of 4 nm to 50 nm.

Figure 18:
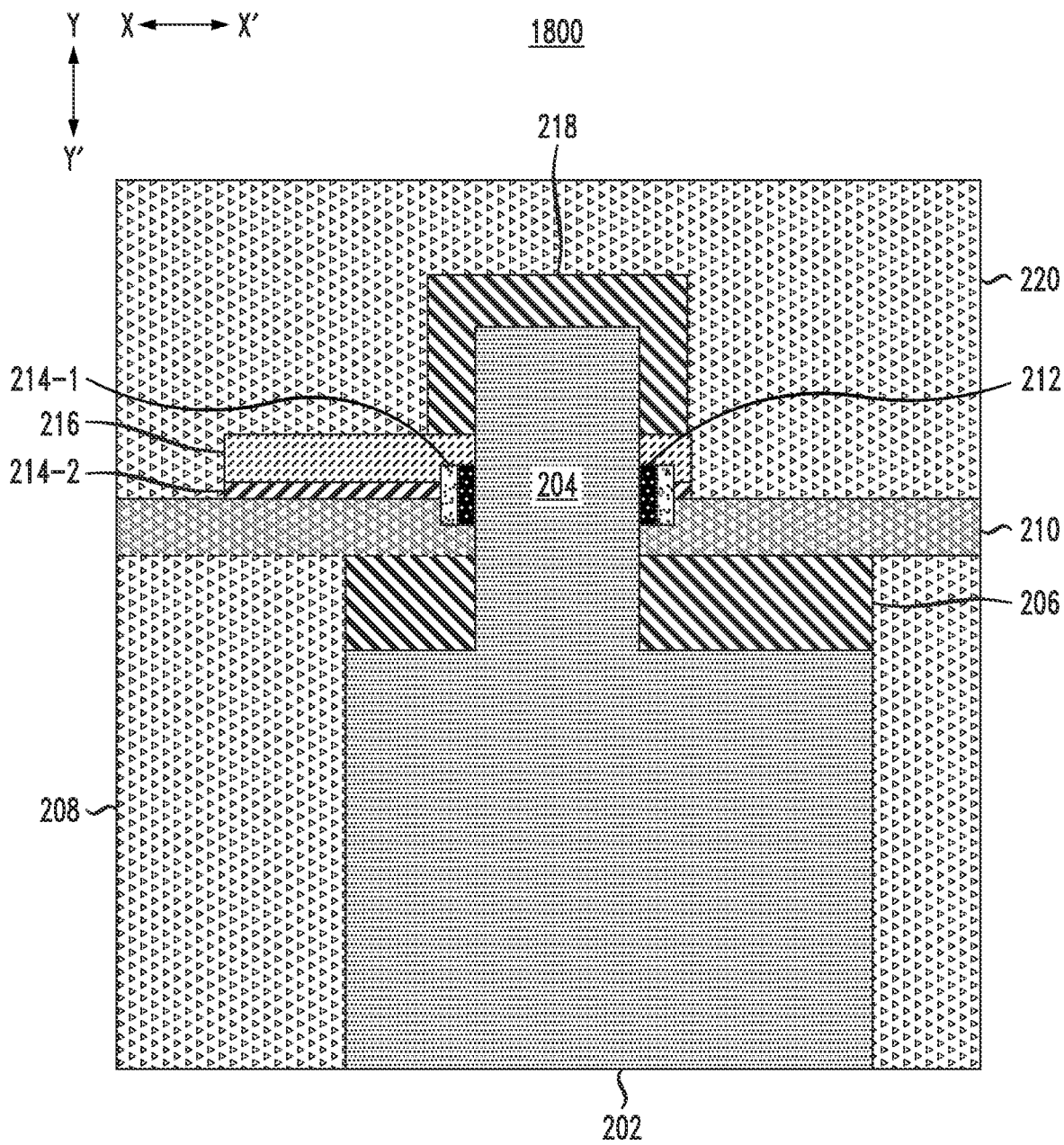
FIG. 18 depicts a side cross-sectional view of the FIG. 17 structure following formation of additional interlayer dielectric material, according to an embodiment of the present invention.

FIG. 18 shows a side cross-sectional view 1800 of the FIG. 17 structure following deposition of additional ILD material that, together with the ILD material 1502, provides the ILD layer 220 of the resulting structure. The ILD layer 220 may have a height or vertical thickness (in direction Y-Y'), as measured from a top surface of the bottom spacer 210, in the range of 5 nm to 300 nm.

Figure 19:
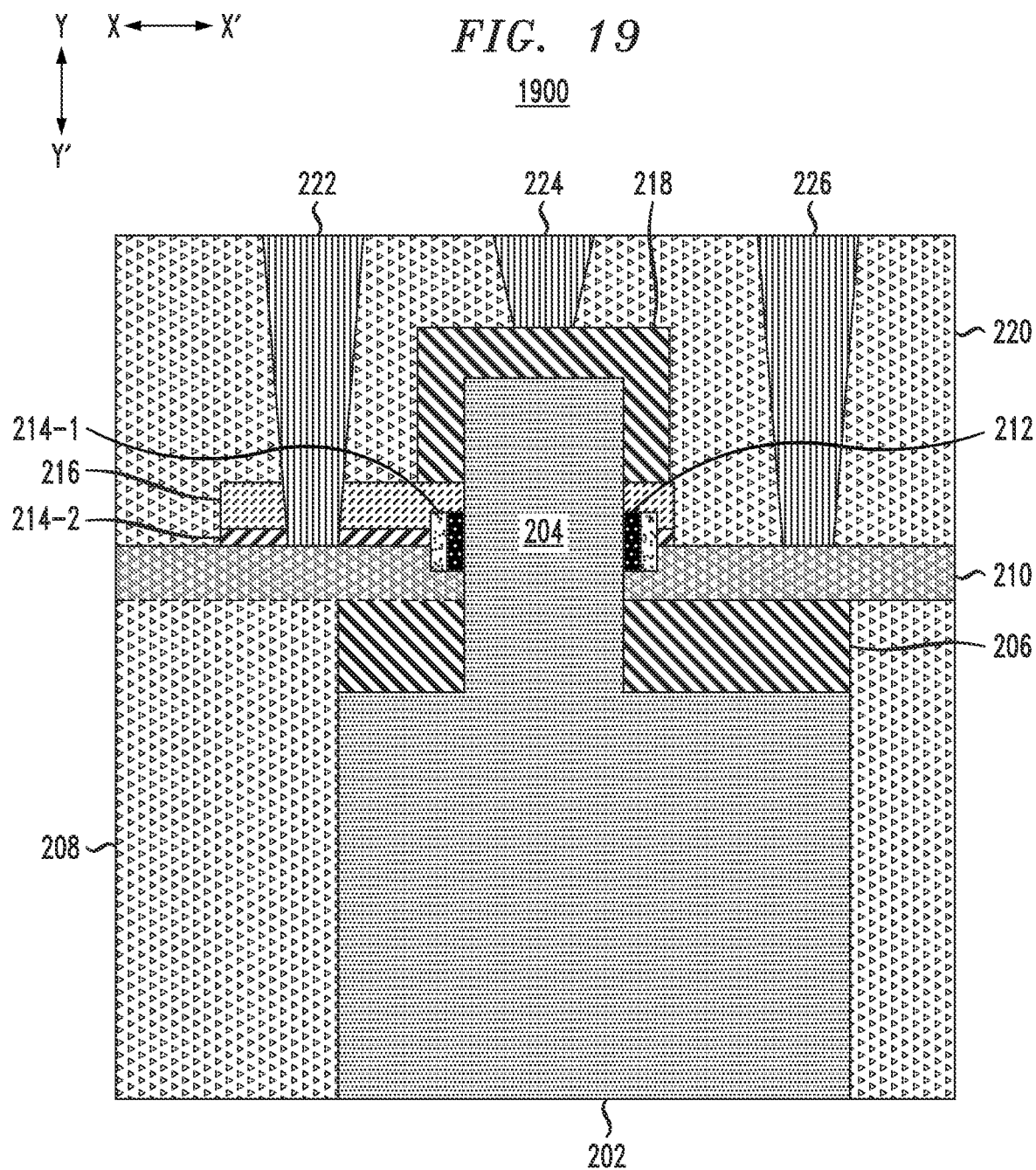
FIG. 19 depicts a side cross-sectional view of the FIG. 18 structure following formation of gate, bottom source/drain and top source/drain contacts, according to an embodiment of the present invention.

FIG. 19 shows a side cross-sectional view 1900 of the FIG. 18 structure following formation of gate contact 222, top source/drain contact 224 and bottom source/drain contact 226. The contacts 222, 224 and 226 may be formed by patterning one or more masks over the ILD layer 220 and etching to expose the gate metal 214-2, top source/drain region 218 and bottom source/drain region 206, respectively. The widths of the contacts 222, 224 and 226 may vary as desired, such as in the range of 10 nm to 80 nm. The contacts 222, 224 and 226 may be formed of materials similar to that of the gate metal 214-2.

In some embodiments, a method of forming a semiconductor structure comprises forming at least one fin over a substrate, the at least one fin providing a channel for at least one VFET, forming a bottom source/drain region over the substrate surrounding a first portion of sidewalls of the at least one fin, and forming a bottom spacer over the bottom source/drain region and surrounding a second portion of the sidewalls of the at least one fin. The method also comprises forming a T-shaped gate stack over the bottom spacer and surrounding a third portion of the sidewalls of the at least one fin, forming a top spacer over the T-shaped gate stack and surrounding a fourth portion of the sidewalls of the at least one fin, and forming a top source/drain region over the top spacer and surrounding a fifth portion of the sidewalls and a top surface of the at least one fin. The T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

Forming the bottom spacer may comprise forming a first portion of the bottom spacer over a top surface of the bottom source/drain region and surrounding the second portion of the sidewalls of the at least one fin.

Forming the T-shaped gate stack may comprise forming the gate dielectric layer over the first portion of the bottom spacer and the at least one fin, forming the gate conductor layer over the gate dielectric layer, and performing a directional etch to remove portions of the gate dielectric layer and the gate conductor layer formed over a top surface of the at least one fin and a top surface of the first portion of the bottom spacer.

Forming the bottom spacer may further comprise forming a second portion of the bottom spacer surrounding a portion of the sidewalls of the gate conductor layer.

Forming the T-shaped gate stack may further comprise forming the gate metal layer over the second portion of the bottom spacer.

Forming the top spacer may comprise forming a first portion of the top spacer over the gate metal layer, recessing the gate dielectric layer and the gate conductor layer to match a top surface of the first portion of the top spacer, and forming a second portion of the top spacer over the first portion of the top spacer, a top surface of the gate dielectric layer, a top surface of the gate conductor layer, and surrounding the fourth portion of the sidewalls of the at least one fin.

The method may further comprise performing a gate cut that removes portions of the top spacer and the gate metal layer spaced apart from the sidewalls of the at least one fin to expose portions of a top surface of the bottom spacer.

Forming the at least one fin may comprise patterning a hard mask layer over the substrate and etching exposed portions of the substrate to form the at least one fin, and forming the bottom source/drain region may comprise forming sidewall spacers on sidewalls of the at least one fin and the hard mask layer, etching the substrate below the sidewall spacers, epitaxially growing the bottom source/drain region over a top surface of the substrate below the sidewall spacers, and removing the sidewall spacers.

The method may further comprise forming a first portion of an ILD layer over the exposed portions of the top surface of the bottom spacer, a top surface of the first portion of the ILD layer matching a top surface of the top spacer.

The hard mask layer may comprise a first nitride layer, an oxide layer over the first nitride layer, and a second nitride layer over the oxide layer. Forming the first portion of the ILD layer may comprise depositing an oxide, performing a reveal that (i) removes the second nitride layer and the oxide layer of the hard mask layer and (ii) recesses the oxide below a top surface of the first nitride layer, removing the first nitride layer, and recessing the oxide to match a top surface of the top spacer.

The method may further comprise forming the top source/drain region over the top surface of the at least one fin and surrounding the fifth portion of the sidewalls of the at least one fin, and forming a second portion of the ILD layer over the first portion of the ILD layer, the top spacer and the top source/drain region.

The method may further comprise forming a gate contact to a portion of the gate metal layer, forming a top source/drain contact to a portion of the top source/drain region, and forming a bottom source/drain contact to a portion of the bottom source/drain region, the gate contact being spaced apart from a first sidewall of the at least one fin and the bottom source/drain contact being spaced apart from a second sidewall of the at least one fin.

Forming the gate contact, the top source/drain contact and the bottom source/drain contact may comprise patterning one or more masks over a top surface of the ILD layer, etching to form a first trench revealing a portion of a top surface of the gate metal layer, a second trench revealing a portion of a top surface of the top source/drain region and a third trench revealing a portion of a top surface of the bottom source/drain region, and forming a contact metal in the first trench, the second trench and the third trench.

In some embodiments, a semiconductor structure comprises a substrate, at least one fin disposed over the substrate, the at least one fin providing a channel for at least one VFET, and a bottom source/drain region disposed over the substrate surrounding a first portion of sidewalls of the at least one fin. The semiconductor structure also comprises a bottom spacer disposed over the bottom source/drain region and surrounding a second portion of the sidewalls of the at least one fin, a T-shaped gate stack disposed over the bottom spacer and surrounding a third portion of the sidewalls of the at least one fin, a top spacer disposed over the T-shaped gate stack and surrounding a fourth portion of the sidewalls of the at least one fin, and a top source/drain region disposed over the top spacer and surrounding a fifth portion of the sidewalls and a top surface of the at least one fin. The T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

A thickness of the bottom spacer below the gate metal layer may be greater than a thickness of the top spacer above the gate metal layer.

The bottom spacer may comprise a first portion disposed over a top surface of the bottom source/drain region surrounding the second portion of the sidewalls of the at least one fin, and a second portion disposed over a top surface of the first portion of the bottom spacer and surrounding a portion of the sidewalls of the gate conductor layer.

The top spacer may comprise a first portion disposed over a top surface of the gate metal layer and surrounding a remaining portion of the sidewalls of the gate conductor layer, and a second portion disposed over a top surface of the first portion of the top spacer, a top surface of the gate dielectric layer, a top surface of the gate conductor layer, and surrounding the fourth portion of the sidewalls of the at least one fin.

The semiconductor structure may further comprise an ILD layer disposed over a remaining portion of the top surface of the second portion of the bottom spacer, a top surface of the second portion of the top spacer, and the top source/drain region.

The semiconductor structure may further comprise: a gate contact disposed in a first trench in the ILD layer, the first trench extending from a top surface of the ILD layer to a portion of the top surface of the gate metal layer spaced apart from a first sidewall of the at least one fin; a top/source drain contact disposed in a second trench in the ILD layer, the second trench extending from the top surface of the ILD layer to a portion of a top surface of the top source/drain region; and a bottom source/drain contact disposed in a third trench in the ILD layer, the third trench extending from the top surface of the ILD layer to a portion of a top surface of the bottom source/drain region.

In some embodiments, an integrated circuit comprises a VFET structure comprising a substrate, at least one fin disposed over the substrate, the at least one fin providing a channel for at least one VFET, and a bottom source/drain region disposed over the substrate surrounding a first portion of sidewalls of the at least one fin. The VFET structure also comprises a bottom spacer disposed over the bottom source/ drain region and surrounding a second portion of the sidewalls of the at least one fin, a T-shaped gate stack disposed over the bottom spacer and surrounding a third portion of the sidewalls of the at least one fin, a top spacer disposed over the T-shaped gate stack and surrounding a fourth portion of the sidewalls of the at least one fin, and a top source/drain region disposed over the top spacer and surrounding a fifth portion of the sidewalls and a top surface of the at least one fin. The T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An integrated circuit comprising:
a vertical field-effect transistor structure comprising:
   a substrate;
   at least one fin disposed over the substrate, the at least one fin providing a channel for at least one vertical field-effect transistor;
   a bottom source/drain region disposed over the substrate surrounding a first portion of sidewalls of the at least one fin;
   a bottom spacer disposed over the bottom source/drain region and surrounding a second portion of the sidewalls of the at least one fin;
   a T-shaped gate stack disposed over the bottom spacer and surrounding a third portion of the sidewalls of the at least one fin;
   a top spacer disposed over the T-shaped gate stack and surrounding a fourth portion of the sidewalls of the at least one fin; and
   a top source/drain region disposed over the top spacer and surrounding a fifth portion of the sidewalls and a top surface of the at least one fin;
wherein the T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

2. A semiconductor structure comprising:

a substrate;

at least one fin disposed over the substrate, the at least one fin providing a channel for at least one vertical field-effect transistor;

a bottom source/drain region disposed over the substrate surrounding a first portion of sidewalls of the at least one fin;

a bottom spacer disposed over the bottom source/drain region and surrounding a second portion of the sidewalls of the at least one fin;

a T-shaped gate stack disposed over the bottom spacer and surrounding a third portion of the sidewalls of the at least one fin;

a top spacer disposed over the T-shaped gate stack and surrounding a fourth portion of the sidewalls of the at least one fin; and a top source/drain region disposed over the top spacer and surrounding a fifth portion of the sidewalls and a top surface of the at least one fin;

wherein the T-shaped gate stack comprises a gate dielectric layer surrounding the third portion of the sidewalls of the at least one fin, a gate conductor layer surrounding the gate dielectric layer, and a gate metal layer extending outward from a portion of sidewalls of the gate conductor layer between the bottom spacer and the top spacer.

3. The semiconductor structure of claim 2, wherein a thickness of the bottom spacer below the gate metal layer is greater than a thickness of the top spacer above the gate metal layer.

4. The semiconductor structure of claim 2, wherein the bottom spacer comprises:

a first portion disposed over a top surface of the bottom source/drain region surrounding the second portion of the sidewalls of the at least one fin; and a second portion disposed over a top surface of the first portion of the bottom spacer and surrounding a portion of the sidewalls of the gate conductor layer.

5. The semiconductor structure of claim 4, wherein the top spacer comprises:

a first portion disposed over a top surface of the gate metal layer and surrounding a remaining portion of the sidewalls of the gate conductor layer; and a second portion disposed over a top surface of the first portion of the top spacer, a top surface of the gate dielectric layer, a top surface of the gate conductor layer, and surrounding the fourth portion of the sidewalls of the at least one fin.

6. The semiconductor structure of claim 5, further comprising an interlayer dielectric layer disposed over a remaining portion of the top surface of the second portion of the bottom spacer, a top surface of the second portion of the top spacer, and the top source/drain region.

7. The semiconductor structure of claim 6, further comprising:

a gate contact disposed in a first trench in the interlayer dielectric layer, the first trench extending from a top surface of the interlayer dielectric layer to a portion of the top surface of the gate metal layer spaced apart from a first sidewall of the at least one fin;

a top/source drain contact disposed in a second trench in the interlayer dielectric layer, the second trench extending from the top surface of the interlayer dielectric layer to a portion of a top surface of the top source/drain region; and a bottom source/drain contact disposed in a third trench in the interlayer dielectric layer, the third trench extending from the top surface of the interlayer dielectric layer to a portion of a top surface of the bottom source/drain region.

* * * * *